US006673163B2

(12) United States Patent
Tomita et al.

(10) Patent No.: US 6,673,163 B2
(45) Date of Patent: Jan. 6, 2004

(54) APPARATUS AND METHOD FOR CLEANING A SEMICONDUCTOR SUBSTRATE

(75) Inventors: Hiroshi Tomita, Yokohama (JP); Soichi Nadahara, Yokohama (JP); Motoyuki Sato, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/179,885

(22) Filed: Jun. 26, 2002

(65) Prior Publication Data

US 2002/0170572 A1 Nov. 21, 2002

Related U.S. Application Data

(62) Division of application No. 09/401,864, filed on Sep. 22, 1999, now Pat. No. 6,431,185.

(30) Foreign Application Priority Data

Oct. 12, 1998 (JP) .......................... 10-288579
Aug. 31, 1999 (JP) .......................... 11-246176

(51) Int. Cl.[7] ................................ B08B 3/00
(52) U.S. Cl. .................. 134/34; 134/1; 134/1.2; 134/1.3; 134/10; 134/95.2; 134/22.1; 134/26; 156/345; 156/643; 118/723
(58) Field of Search ............... 134/1, 10, 1.2, 134/1.3, 95.2, 11, 22.1, 26, 30; 156/345, 643; 118/723

(56) References Cited

U.S. PATENT DOCUMENTS

| 4,827,867 A | * | 5/1989 | Takei et al. ............ 118/64 |
| 5,368,649 A | * | 11/1994 | Tsukazaki ............... 134/1 |
| 5,468,302 A | | 11/1995 | Thietje ................. 134/1 |
| 5,518,542 A | * | 5/1996 | Matsukawa et al. ...... 118/52 |
| 5,540,245 A | | 7/1996 | Munakata et al. ....... 134/76 |
| 5,562,778 A | | 10/1996 | Koretsky et al. ........ 134/1 |
| 5,698,038 A | * | 12/1997 | Guldi et al. ............ 134/1 |
| 5,762,084 A | * | 6/1998 | Krusell et al. .......... 134/184 |

(List continued on next page.)

FOREIGN PATENT DOCUMENTS

| JP | 3-148825 | 6/1991 |
| JP | 8-52443 | 2/1996 |

OTHER PUBLICATIONS

Nadahara, S. "Cavitation Jet Cleaning After CMP", The 2nd International CMP Syposium, pp. 277–280, (1996).

(List continued on next page.)

Primary Examiner—Randy Gulakowski
Assistant Examiner—Gentle E. Winter
(74) Attorney, Agent, or Firm—Finnegan, Henderson, Farabow, Garrett & Dunner, L.L.P.

(57) ABSTRACT

There is proposed an apparatus and method for cleaning a semiconductor substrate, which make it possible to minimize the adhesion of mist in a cleaning tank at the occasion of cleaning a semiconductor substrate, to realize a high removal effect of residual polishing particles, and to enable to obtain a clean surface. In view of preventing a mist generated by the jet of high pressure water from re-adhering to the substrate during the cleaning of a semiconductor substrate, a cover member is disposed at a mist-generating region so as to prevent the splash of the mist. Additionally, a cavity is caused to generate by contacting a high pressure water with a still water, and high-frequency generated by the generation of the cavity is utilized for removing the residual polishing particles. Alternatively, the ejection of high pressure water against the surface of the substrate is performed in a liquid phase such as ultrapure water, thereby preventing the generation of mist.

15 Claims, 17 Drawing Sheets

U.S. PATENT DOCUMENTS

| | | | |
|---|---|---|---|
| 5,868,866 A | | 2/1999 | Makawa et al. ............... 134/34 |
| 5,906,687 A | * | 5/1999 | Masui et al. .................. 134/1.3 |
| 6,136,724 A | * | 10/2000 | Hansen et al. ............... 438/745 |
| 6,308,369 B1 | * | 10/2001 | Garcia et al. .................. 15/230 |
| 6,413,355 B1 | * | 7/2002 | Kamikawa et al. ......... 438/745 |

OTHER PUBLICATIONS

Krusell et al.,:"Mechanical Brush Scrubbing for Post–CMP Clean," *Solid State Technology*, pp. 109–114 (1995).

Hymes et al., Brush Scrubbing Emerges As Future Wafer–Cleaning Technology, Jul. 1, 1997, Internet, vol. 40, pp. 1–9.

* cited by examiner

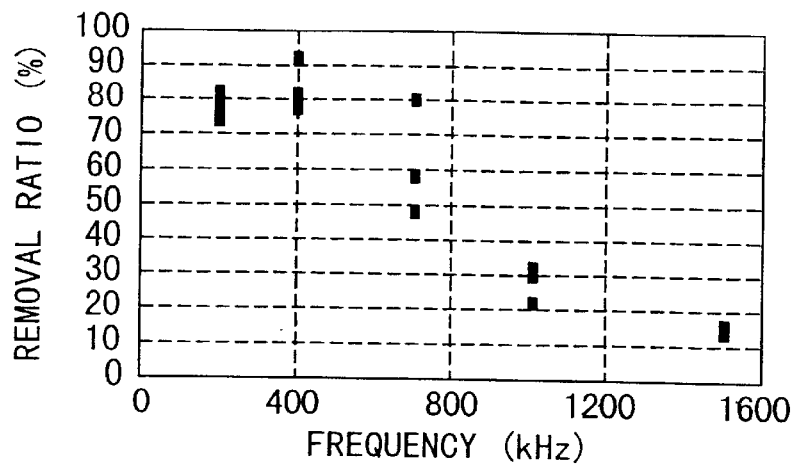
FIG. 7  FREQUENCY DEPENDENCY OF MJ CLEANING (BARE-Si WAFER)
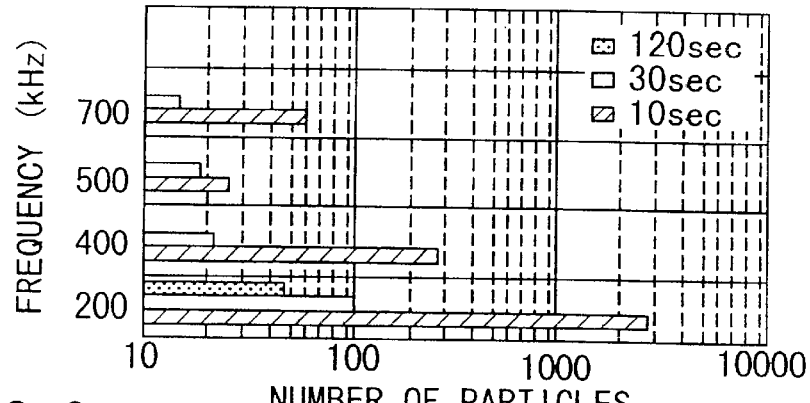
FIG. 8  WASHING TIME DEPENDENCY OF MJ CLEANING (BARE-Si WAFER)
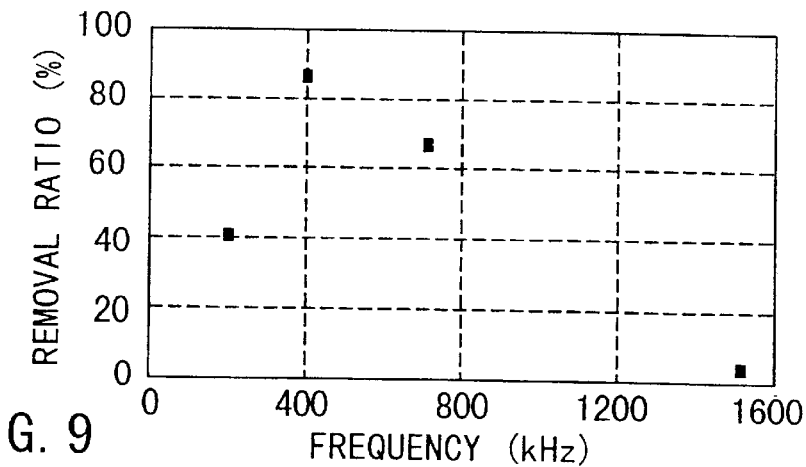
FIG. 9  FREQUENCY DEPENDENCY OF MJ CLEANING (SiN/Si WAFER:L&S)

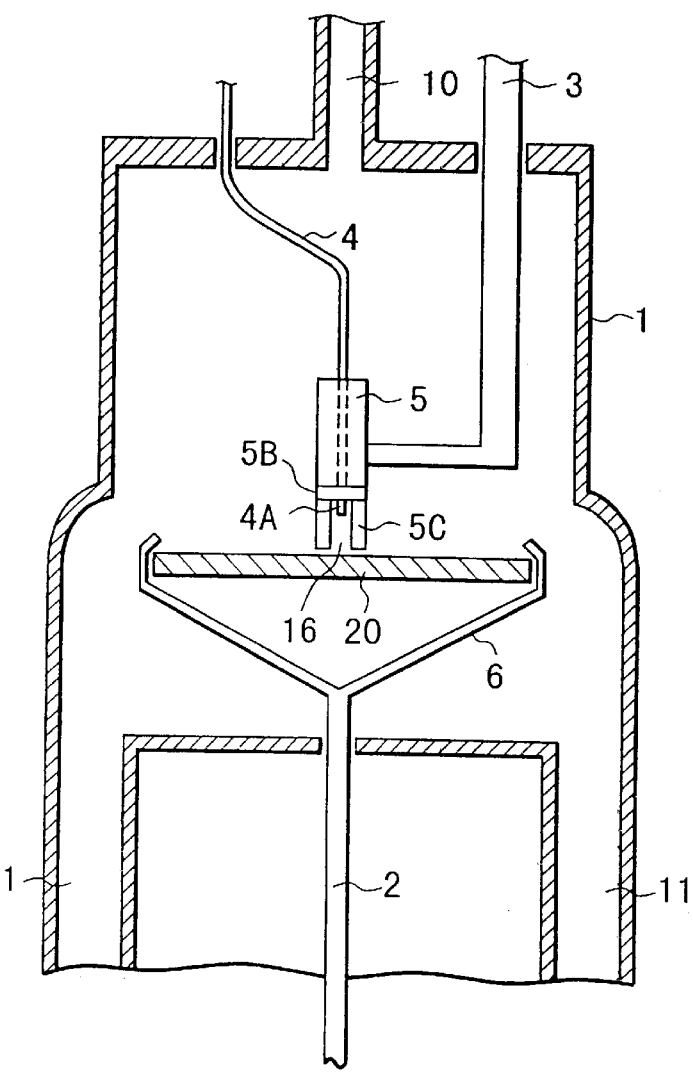
FIG. 10
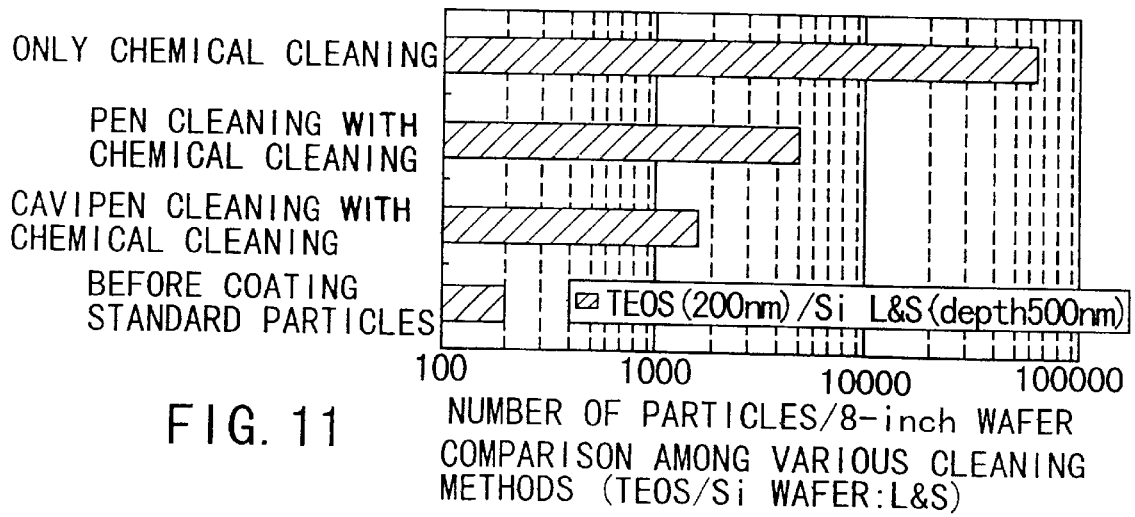
FIG. 11 NUMBER OF PARTICLES/8-inch WAFER
COMPARISON AMONG VARIOUS CLEANING
METHODS (TEOS/Si WAFER:L&S)

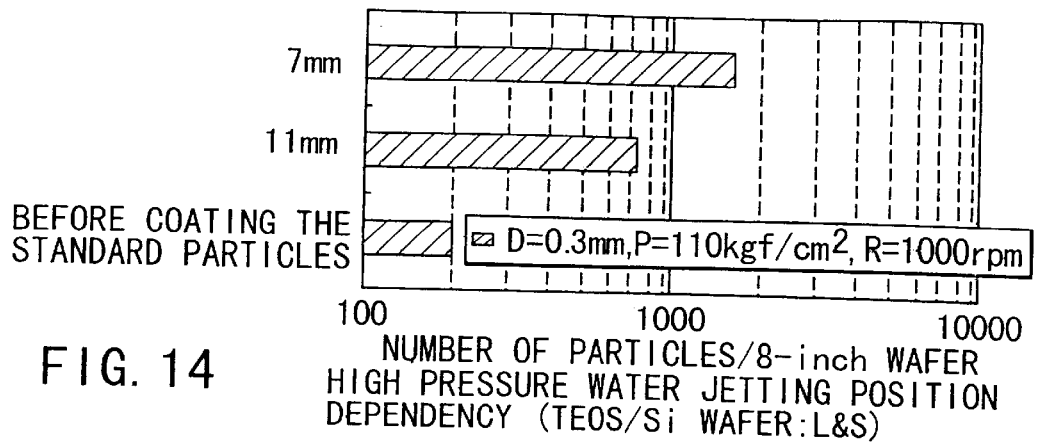
FIG. 14 HIGH PRESSURE WATER JETTING POSITION DEPENDENCY (TEOS/Si WAFER:L&S)
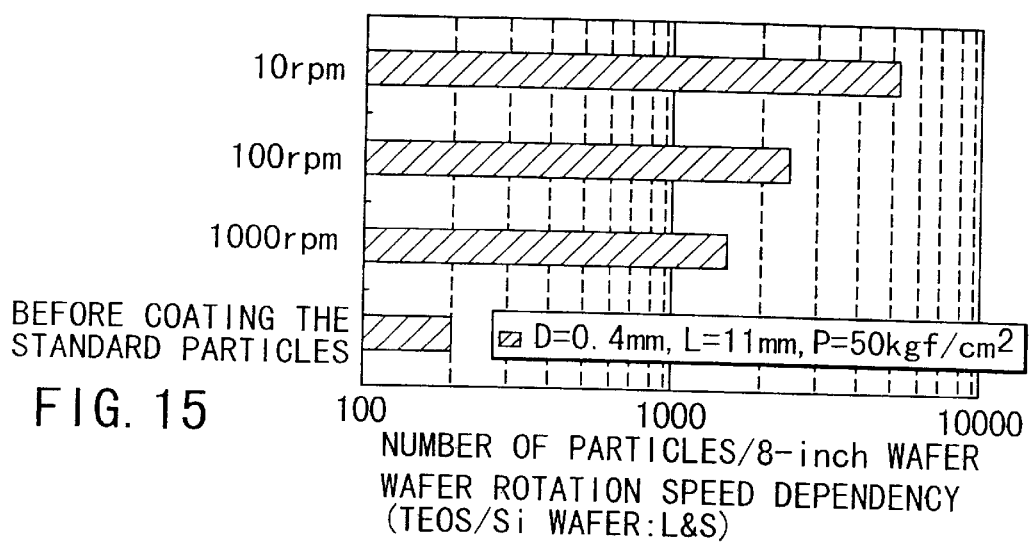
FIG. 15 WAFER ROTATION SPEED DEPENDENCY (TEOS/Si WAFER:L&S)
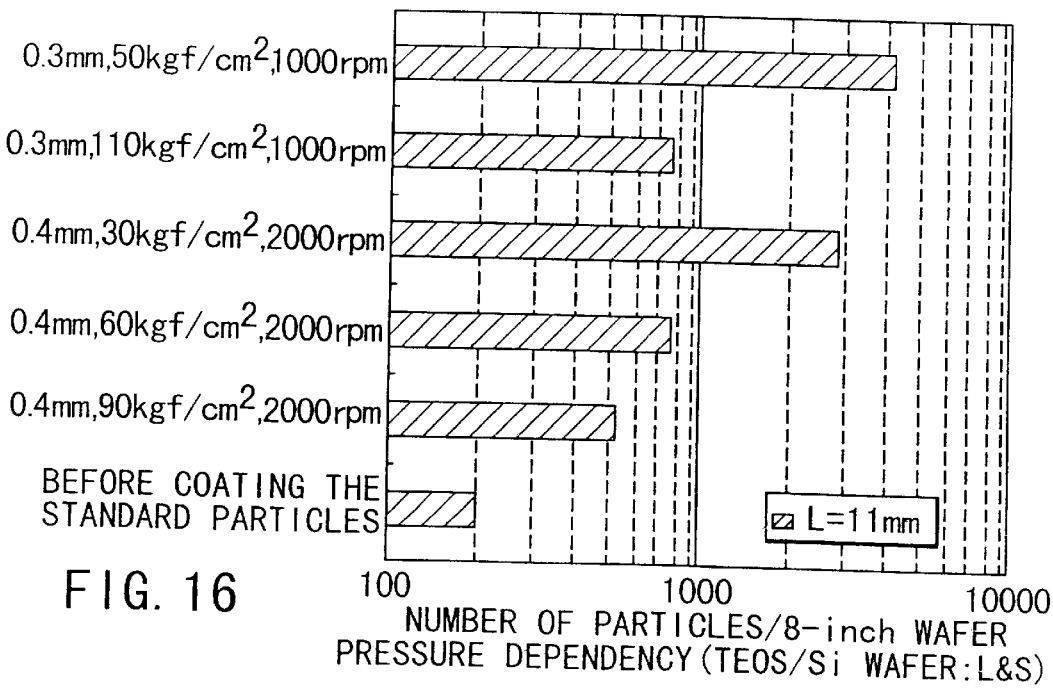
FIG. 16 PRESSURE DEPENDENCY (TEOS/Si WAFER:L&S)

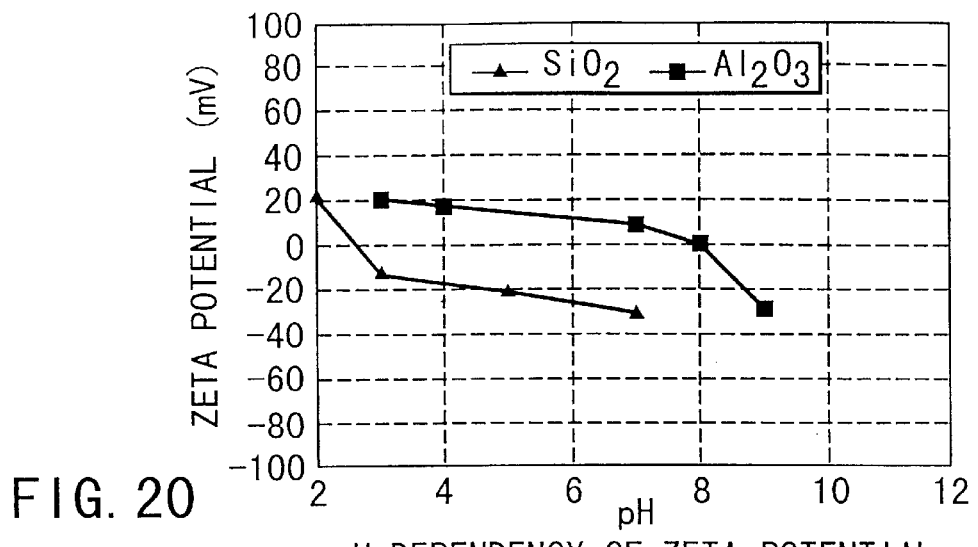
FIG. 20  pH DEPENDENCY OF ZETA POTENTIAL (Si, SiN, SiO2)
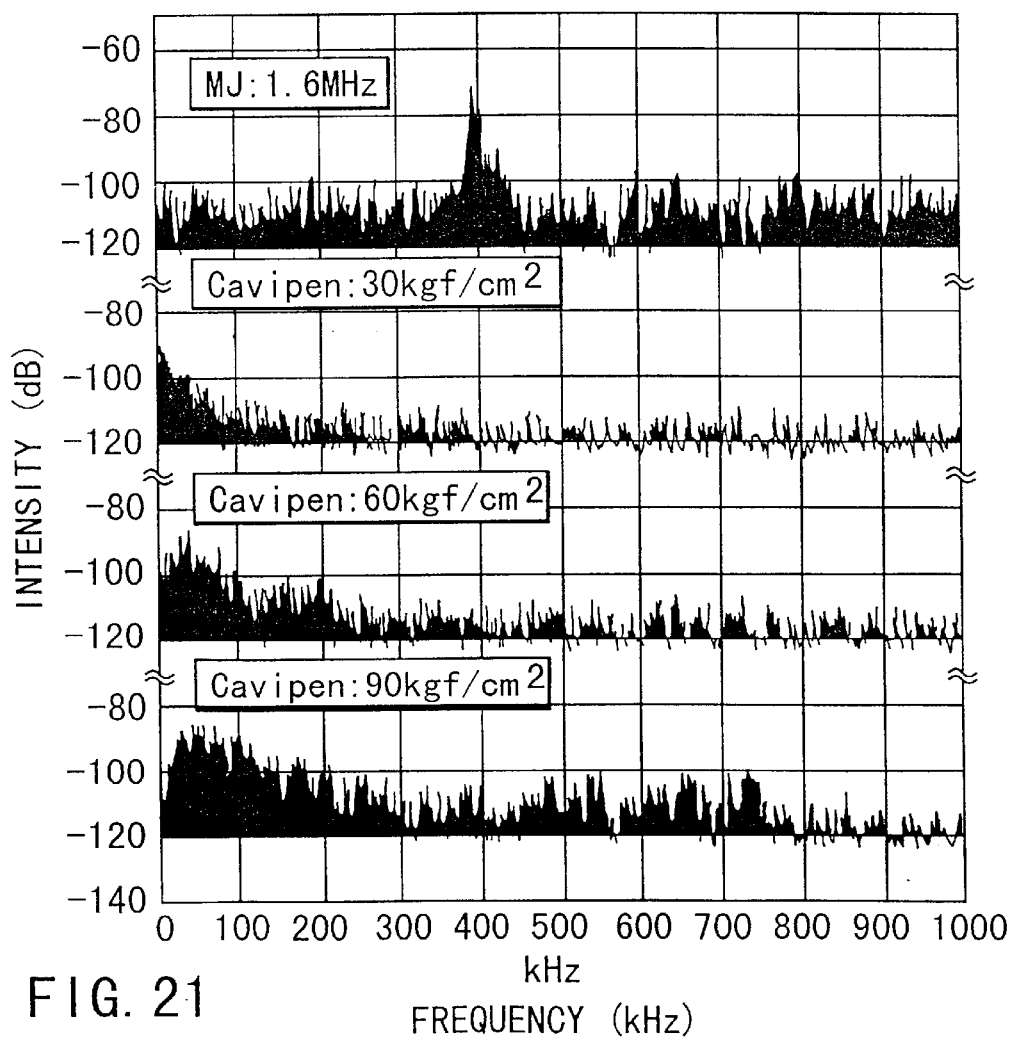
FIG. 21

APPARATUS AND METHOD FOR CLEANING A SEMICONDUCTOR SUBSTRATE

This is a division of application Ser. No. 09/401,864, filed Sep. 22, 1999, now U.S. Pat. No. 6,431,185 which is incorporated herein by reference.

BACKGROUND OF THE INVENTION

This invention relates to an apparatus and method for cleaning a semiconductor substrate, and in particular to an apparatus and method for cleaning a semiconductor substrate of sheet form, which make it possible to fully remove even fine particles. Specifically, this invention relates to novel cleaning method consisting of a combination of the conventional contact cleaning (Pen) and non-contact cleaning (CJ) (Cavitation-jet composite pen cleaning method: hereinafter referred to as "Cavipen cleaning method"), which enables the flat portion and recessed portion of a cleaning material to be simultaneously cleaned.

As the working dimension in the manufacture of a semiconductor device becomes increasingly finer such as in the order of submicron, even a very fine particle may become a cause for the generation of a defective product, when the particle is allowed to adhere on the surface of a semiconductor substrate to be employed in the production of a semiconductor device. Therefore, it is now demanded to develop a construction schedule control which makes it possible to completely remove such a very fine particle. Further, when a metallic impurity is allowed to adhere onto the surface of a semiconductor substrate, it may become a cause for a failure of electric characteristics even such a metallic impurity is very little in quantity, so that it is also demanded to completely remove such a metallic impurity.

To meet such a demand, there has been recently developed a method for effectively removing particles adhered onto a surface of a substrate, wherein a high pressure pure water impressed with ultrasonic wave of Mega Hertz band is employed to clean the substrate to thereby obtain a very high clean surface of the substrate. An apparatus utilizing such a method is also being developed now.

For example, a sheet cleaning type apparatus utilizing the aforementioned method is known. However, there are a problem that a mist of steam is allowed to generate in the gas phase especially when (1) a high pressure water is jetted against the surface of a semiconductor substrate, or (2) a high-frequency wave (megasonics) is impressed at the occasion of cleaning the substrate by making use of a cleaning nozzle of various type (e.g. a water jet nozzle, a cavitation jet nozzle, megasonic device-attached water jet nozzle, etc.) which is designed to be mounted on the sheet cleaning type apparatus. This mist may be re-adsorbed in a subsequent drying step after the cleaning of a semiconductor substrate, thus rendering the mist to remain as a water mark on the surface of the substrate. Otherwise, this mist may adhere to the dust in the gas phase, thus rendering the mist to be re-adsorbed as a particle on the surface of the substrate. By the way, by the expression of a high pressure water, it means a water having a pressure in the order of several Kgf/cm$^2$ in the case of the megasonic device-attached water jet nozzle, and a pressure in the range of several tens Kgf/cm$^2$ to several hundreds Kgf/cm$^2$ in the case of the a water jet nozzle or a cavitation jet nozzle.

In view of preventing such a mist from being allowed to generate, there has been developed a semiconductor cleaning apparatus which is provided with exhaust ports to be disposed around a semiconductor substrate so as to forcibly discharge the mist.

In the followings, the general structure of the conventional semiconductor cleaning apparatus will be explained with reference to FIG. 34.

FIG. 34 represents a schematic view of the main portion of the conventional sheet form semiconductor substrate cleaning apparatus wherein a semiconductor substrate is placed inside the cleaning apparatus. The reference number 1 denotes the chamber of a semiconductor substrate cleaning apparatus, which is cylindrical in configuration with the top and bottom surfaces thereof being closed. A rod-like substrate holder 2 is disposed inside the chamber 1 in such a manner that it passes through a central portion of the bottom of the chamber 1 while keeping an air-tightness between the bottom of the chamber 1 and the substrate holder 2 and at the same time, ensuring the rotatability of the substrate holder 2 in relative to the bottom of the chamber 1. This substrate holder 2 is connected at one end thereof with a rotating mechanism (not shown) which is disposed outside the chamber 1 thereby enabling the substrate holder 2 to be revolved at a high speed. The other end of the substrate holder 2 which is disposed inside the chamber 1 is connected with a substrate-mounting jig 6. Namely, it is designed such that a semiconductor substrate 20 can be horizontally mounted on the substrate-mounting jig 6 and revolved through the rotation of the substrate holder 2. Further, a nozzle 4 for jetting a high pressure water jet is disposed inside the chamber 1 in such a manner that the tip end 4A of the nozzle 4 is positioned over and slightly spaced away from the top surface of the semiconductor substrate 20. The nozzle 4 is fixingly retained, through a portion near the tip end 4A thereof, by a nozzle frame 5.

On the other hand, a rod-like nozzle-supporting arm 3 is disposed inside the chamber 1 in such a manner that it passes through an upper peripheral surface portion of the chamber 1 while keeping an air-tightness between the upper peripheral surface portion of the chamber 1 and the nozzle-supporting arm 3 and at the same time, ensuring the rotatability of the nozzle-supporting arm 3 in relative to the upper peripheral surface portion of the chamber 1. This nozzle-supporting arm 3 is connected at an upper end thereof with a rotating mechanism (not shown) which is disposed outside the chamber 1 thereby enabling the nozzle-supporting arm 3 to be revolved at a predetermined range of angle. Further, a lower portion of the nozzle-supporting arm 3 which is disposed inside the chamber 1 is L-shaped with the distal end thereof being directed toward the center of the chamber 1 and fixed to the nozzle frame 5.

According to this cleaning apparatus, when the nozzle-supporting arm 3 is rotated to a predetermined angle, the nozzle frame 5 is enabled to scan an entire area along the diametral direction of the semiconductor substrate 20, and when the substrate holder 2 is additionally rotated, the entire surface of the semiconductor substrate 20 can be allowed to come close to the tip end 4A of the nozzle 4.

The nozzle 4 is designed to function also as a feeding pipe for feeding water of high pressure and hence, formed of a flexible tube such as a fine stainless steel tube or a Teflon tube. Further, while ensuring air tightness in relative to the chamber 1, the nozzle 4 is extended out of an upper portion of the chamber 1, leaving a sufficient length thereof inside the chamber 1 so as enable it to follow the rotation of the nozzle-supporting arm 3. One end portion of the chamber 1 is connected with a high pressure water feeding source (not shown) thereby making it possible to continuously feed a high pressure water.

A gas inlet port 10 is formed at a central portion of the upper surface of the chamber 1 thereby making it possible to feed an inert gas such as nitrogen gas into the chamber 1. On the other hand, an exhaust port 11 connected with an outside exhauster (not shown) is formed at a lower portion of the chamber 1 which is lower than the mounting portion of the semiconductor substrate 20, thereby allowing an inert gas fed through the gas inlet port 10 to be discharged from this exhaust port 11. It is possible with this construction to pass an inert gas through the chamber 1 at the occasion of cleaning the surface of the semiconductor substrate 20 by making use of an ejection of a high pressure water, thereby effectively guide and move a mist that has been generated from the high pressure water toward the exhaust port 11 together with the introduced inert gas. At the same time, the high pressure water can be also effectively discharged together with the inert gas.

Next, the method of cleaning the surface of a semiconductor substrate by making use of the aforementioned apparatus will be explained.

First of all, the semiconductor substrate 20 is placed inside the chamber 1, setting it close to the tip end 4A of the nozzle 4 (FIG. 34).

Then, the substrate holder 2 and the nozzle supporting arm 3 are respectively rotated at a desired angle, and at the same time, nitrogen gas is introduced into the chamber 1 from the gas inlet port 10 and discharged from the exhaust port 11 to thereby form a gas flow inside the chamber 1. Then, a high pressure water is allowed to jet from the tip end 4A of the nozzle 4 so as to clean the surface of the semiconductor substrate 20.

In this case, if a high-frequency wave in the order of 1.6 MHz for instance is impressed in advance on the high pressure water, the high-frequency waves will be propagated to the surface of the semiconductor substrate 20 at the moment of jetting a high pressure water, whereby the fine dust that has been adhered onto the surface of the semiconductor substrate 20 would be vibrated and excited, thus causing the fine dust to float upward and enabling the fine dust to be easily removed by the high pressure water. As a result, a clean surface of the semiconductor substrate 20 can be obtained. Although a large quantity of mist may be generated inside the chamber 1 at this moment, since the aforementioned gas flow is formed inside the chamber 1, the mist generated can be discharged together with the gas flow from the exhaust port 11.

Thereafter, the feeding of the high pressure water is stopped, and only the rotation of the substrate holder 2 is continued thereby allowing the semiconductor substrate 20 to dry by the effect of spin-drying.

Next, a cleaning method according to the prior art will be explained.

A cleaning method that has been increasingly employed for the flattening process of semiconductor device after the development of 64 MDRAM and that can be performed using a Chemical Mechanical Polishing (CMP) apparatus is consisted of a flattening (polishing) step and a cleaning step based on a concept of Dry in/out that means that a semiconductor substrate under dry condition is transferred into a CMP apparatus, and the substrate, and the semiconductor substrate is transferred out of the CMP apparatus under dry condition after the completion of planar process and cleaning process therefor.

In the flattening step of wafer, which is a main object of the CMP, chemicals with a polishing particle called slurry are employed. Examples of the polishing particle include alumina ($Al_2O_3$), silica ($SiO_2$), ceria ($CeO_2$), etc. The material to be treated by the CMP may be an oxide film, a polysilicon film, tungsten (W), aluminum (Al), copper (Cu). A main object of the cleaning step is to remove the polishing particle employed in the flattening step.

A method of CMP post cleaning which enables to effectively remove the polishing particle remaining on the surface of wafer after the CMP has been also studied by the present inventors. By the way, the CMP post cleaning set forth in the present specification means a cleaning method wherein a wet wafer obtained after finishing the flattening step is spin-dried as it is. Specific examples of such a CMP post cleaning are a roll/sponge cleaning (RS), a pencil sponge cleaning (Pen), a mega-sonic cleaning (MJ), a cavitation jet cleaning (CJ), etc. This CMP post cleaning method currently employed is mainly performed by way of a two-step cleaning wherein the R/S cleaning and the Pen cleaning are sequentially performed, or by way of a three-step cleaning wherein the R/S cleaning, the Pen cleaning and MJ cleaning are sequentially performed.

First of all, problems involved in the employment of the aforementioned conventional semiconductor substrate cleaning apparatus will be explained.

(1) The high pressure water to be jetted from the tip end 4A of the nozzle 4 invites the generation of a large quantity of mist on the surface of the semiconductor substrate 20. Although most of the mist thus generated is discharged from the exhaust port 11, there still remains a relatively large quantity of mist floating in the chamber 1, thereby allowing this floating mist to re-adhere onto the surface of the semiconductor substrate 20. There is a possibility that dust in the gas phase is adsorbed to this mist so that when the water of the mist accompanying the dust is subsequently evaporated, the dust may be left adhered onto the surface of the semiconductor substrate 20, thus making it difficult to remove the dust. Even in the case where mist not accompanying dust is adsorbed to the surface of the semiconductor substrate 20 and then evaporated later, the trace of the mist may be left as so-called water mark.

(2) Since part of mist is left floated inside the chamber as mentioned above, there is much possibility that the mist adhere onto the inner wall of the chamber. Although this inner wall is usually formed of vinyl chloride, if a cleaning liquid containing an acid or an alkali is employed for cleaning a semiconductor substrate, the acid (for example, hydrochloric acid) may react with the alkali (for example, an aqueous solution of ammonia) to form a salt such as ammonium chloride on the surface of the inner wall of the chamber, thus allowing the salt to be left adhered to the inner wall of the chamber as a source for generating particles. Although the aforementioned cleaning liquid is stronger in detergency as compared with pure water, it cannot be employed due to the problems mentioned above.

The following methods have been proposed for solving the above problems.

a) A guard ring type cup is mounted encircling the outer periphery of the semiconductor substrate 20, thereby preventing the generation of the mist which is most likely to be generated from the outer peripheral portion of the semiconductor substrate.

b) A disc having almost the same configuration as that of the semiconductor substrate is placed over the semiconductor substrate, and a solution (liquid) of chemicals is introduced through the central portion of the disc to fill the space between the disc and the wafer with the solution of chemicals to clean the surface of the semiconductor substrate while suppressing the generation of mist.

However, in the case of the method a), although it is possible to prevent the generation of mist around the wafer (semiconductor substrate), it is impossible to prevent mist from generating above the wafer. In the case of the method b), although it is possible to suppress the generation of mist, the essential advantage of water jet which results from the application of ultrasonic wave cannot be obtained.

Next, problems involved in the employment of the aforementioned cleaning method of the prior art will be explained.

FIGS. 35A and 35B illustrate a state where polishing particles remain on the polished surface of a wafer after the flattening step according to the CMP. Specifically, FIG. 35A shows a cross-sectional view of a dishing, FIG. 35B a cross-sectional view of a scratch, and FIG. 35C a cross-sectional view of an alignment marker, wherein the reference numeral 61 denotes polishing particles left remained, the reference numeral 62 a residue of a film that has been once formed on the surface of the wafer but is left remained in a recessed portion, and the reference numeral 63 the wafer.

Depending on the configuration of pattern and the conditions of CMP, the aforementioned recessed portions such as dishing and scratch are caused to be formed on the surface of the wafer, thereby allowing polishing particles to be left remained therein. As another example of such a recessed portion to be formed in the W-CMP, there is an alignment marker (FIG. 3C) which is employed in a photolithography process, thereby creating a possibility that the alignment marker may be clogged with polishing particles. These residual particles are required to be removed.

As for the method for removing these residual particles, there have been proposed a method wherein the residual particles are removed by making use of a physical force and a method wherein the residual particles are removed by making use of a chemical force. As for the former method to remove the residual particles by making use of a physical force, it may be classified into a contact method and a non-contact method.

Among the method to remove the residual particles by making use of a physical force, the contact method (for example, a two-step cleaning consisting of the R/S cleaning and the Pen cleaning) is incapable of directly contacting with the polishing particles buried in a recess, thereby making it very difficult to effectively remove the polishing particles left remained in these dishing, scratch and alignment mark.

There has been also studied to remove the residual particle by means of a non-contact type physical cleaning method such as MJ or CJ. However, in the case of the MJ cleaning, there is a problem that the relationship between the conditions of hardware such as the frequency or output of ultrasonic and the removal ratio of particle alters depending on the dissolved gas concentration of ultrapure water to be employed in the cleaning, thus making it difficult to utilize this MJ cleaning. On the other hand, in the case of the CJ cleaning, there is a problem that a mist of cleaning chemical solution is caused to generate due to the blow-out of high pressure water or due to the vertical ejection of high pressure water against a wafer, thus generating a re-staining by a water mark during the drying step.

Meantime, the assessment of non-contact type physical cleaning such as the MJ or CJ cleaning is generally performed based mainly on the detergency against the particles that have been adsorbed on the surface of a wafer which is flat and free from any recessed portion. Namely, the assessment of detergency against the particles that have been buried in a standardized recessed portion has been scarcely conducted so far.

BRIEF SUMMARY OF THE INVENTION

Therefore, there has been developed a novel cleaning method by the present invention which takes advantage of the conventional contact cleaning (Pen) and non-contact cleaning (CJ) (Cavitation-jet composite pen cleaning method: hereinafter referred to as "Cavipen cleaning method), thus proposing a novel CMP post-cleaning method which makes it possible to simultaneously clean a flat portion as well as a recessed portion of the surface of cleaning material.

Namely, in view of solving the aforementioned problems, the present invention provides a cleaning method of semiconductor substrate, which comprises the steps of:

placing a semiconductor substrate on a substrate holder installed inside a semiconductor substrate cleaning apparatus;

rotating the semiconductor substrate; and impressing a high-frequency wave on the semiconductor substrate while jetting a high pressure cleaning liquid to a surface to be cleaned (hereinafter referred to also as a cleaning surface) of the semiconductor substrate being kept rotated.

The high-frequency wave to be employed in the aforementioned method should preferably include a high-frequency component of 400 kHz, and also preferably include frequency components continuous within the range of 800 kHz or less. When the high-frequency wave is constituted in this manner, particles of various diameter adhering on the surface of substrate can be effectively removed.

It is also preferable in this method that the high-pressure cleaning liquid is jetted at the cleaning surface from a cleaning nozzle which is mounted movably over the surface of the semiconductor substrate, that the inner diameter of the cleaning nozzle is 0.3 mm or more, and that the distance between the cleaning surface and the cleaning nozzle (a high pressure water blow-out height) is 7 mm or more. The rotating speed of the semiconductor substrate should preferably be not less than 10 rpm, or more preferably 1,000 rpm or more. The pressure to be applied to the high pressure cleaning liquid should preferably be not less than 30 kgf/cm$^2$. It is possible by selecting these conditions in this manner to enhance the cleaning effect where the cavity for generating a high-frequency wave has been effectively formed.

The high-frequency wave including the continuous frequency components may be generated by a single high-frequency generating apparatus comprising a pencil sponge having an open end and a hollow portion connected with this open end, and a cleaning nozzle whose distal end is projected toward the hollow portion. It becomes possible by constructing the high-frequency generating apparatus in this manner to concurrently apply high-frequency waves including various frequency components to the cleaning surface without necessitating the installation of a plural number of high-frequency generating apparatus.

It is also preferable in the aforementioned cleaning method that the pH of the cleaning liquid is selected in such a manner that the zeta potential of the cleaning surface has the same polarity as the zeta potential of the particle to be adhered to the cleaning surface. Alternatively, in addition to the selection of pH of the cleaning liquid, the zeta potential of the particle may be controlled by making use of a surfactant (a cationic surfactant or an anionic surfactant). It is possible by controlling these potentials in this manner to bring about a repulsive force due to the zeta potential difference between the particle adhering to the cleaning surface and the cleaning surface, and hence, to keep the particles away from the cleaning surface or to prevent the particles from re-adhering to the cleaning surface. As a result, the cleaning effect can be enhanced.

Further, in view of solving the aforementioned problems, the present invention provides a substrate cleaning apparatus, which comprises:

a substrate holder for holding a substrate;

a high pressure water-jetting mechanism having a jet nozzle which is directed to face a main surface of the substrate held by the substrate holder;

a chamber housing the substrate holder and the high pressure water-jetting mechanism;

a gas-feeding port communicated with the chamber; and a gas exhaust port communicated with the chamber;

wherein the high-pressure water-jetting mechanism is composed of a high-pressure water jetting portion and a high-pressure water splash-preventing portion.

The gas-feeding port should preferably be designed such that it is capable of functioning also as a water drainage port.

It is also preferable that the high pressure water jetting portion is constituted by a high pressure water feeding nozzle tip, and the high pressure water splash-preventing portion is constituted by a covering member placed around the high pressure water feeding nozzle tip.

The covering member should preferably be formed of a hollow cylindrical sponge disposed close to the high pressure water feeding nozzle tip and having a cavity formed below the high pressure water feeding nozzle tip.

A substrate cleaning apparatus according to another embodiment of the present invention comprises:

a substrate holder for holding a substrate;

a high pressure water-jetting mechanism provided with an ejection nozzle which is directed to face a main surface of the substrate held by the substrate holder;

a chamber housing the substrate holder and the high pressure water-jetting mechanism;

a gas-feeding port communicated with the chamber; and a gas exhaust port communicated with the chamber;

and which further comprises a rinsing water feeding pipe for feeding a rinsing water to the other main surface of the substrate.

A substrate cleaning apparatus according to still another embodiment of the present invention comprises:

a substrate holder for holding a substrate;

a high pressure water-jetting mechanism provided with an ejection nozzle which is directed to face a main surface of the substrate held by the substrate holder;

a chamber housing the substrate holder and the high pressure water-jetting mechanism;

a gas-feeding port communicated with the chamber; and a gas exhaust port communicated with the chamber;

and which further comprises a cleaning tank which is capable of storing a liquid therein and which is housed inside the chamber, the cleaning tank being also capable of housing therein the high pressure water-jetting mechanism and the substrate holder.

Each of the substrate cleaning apparatus should preferably be constructed that the high pressure water-jetting mechanism is provided therein with a high-frequency wave oscillator which is capable of applying high-frequency waves within the range of 300 kHz to 3 MHz to the jetted flow of high pressure water.

The present invention also provides a cleaning method of semiconductor substrate, which comprises the steps of:

placing a semiconductor substrate on a substrate holder installed inside a substrate cleaning apparatus;

housing the substrate holder in a cleaning tank placed inside the substrate cleaning apparatus;

filling the cleaning tank with a cleaning liquid thereby dipping the semiconductor substrate in the cleaning liquid; and jetting a high-pressure water against one main surface of the semiconductor substrate inside the cleaning tank.

Additional objects and advantages of the invention will be set forth in the description which follows, and in part will be obvious from the description, or may be learned by practice of the invention. The objects and advantages of the invention may be realized and obtained by means of the instruments and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a graph illustrating the frequency dependency of the cleaning effect in the MJ cleaning;

FIG. 8 is a graph illustrating the time dependency of the cleaning effect in the MJ cleaning;

FIG. 9 is a graph illustrating the frequency dependency of the cleaning effect in the MJ cleaning which was applied to a sample wherein a film was formed on a wafer having a recessed portion;

FIG. 10 is a schematically sectional view illustrating an apparatus for executing the Cavipen cleaning method according to a second example of this invention;

FIG. 11 is a graph illustrating the result of a test for comparing the effects of removing and cleaning particles according to the Cavipen cleaning method with the effects obtained by other cleaning methods;

FIG. 14 is a graph illustrating the high-pressure water blow-out position dependency of the cleaning effect in the Cavipen cleaning method;

FIG. 15 is a graph illustrating the wafer rotation speed dependency of the cleaning effect in the Cavipen cleaning method;

FIG. 16 is a graph illustrating the pressure dependency of the cleaning effect in the Cavipen cleaning method;

FIG. 20 is a graph illustrating the pH dependency of zeta potential of $SiO_2$ film and of $Al_2O_3$ film;

FIG. 21 is a graph illustrating the frequency characteristics of the MJ cleaning and of the Cavipen cleaning in each frequency as measured by making use of a sound pressure sensor;

DETAILED DESCRIPTION OF THE INVENTION

Figure 1:
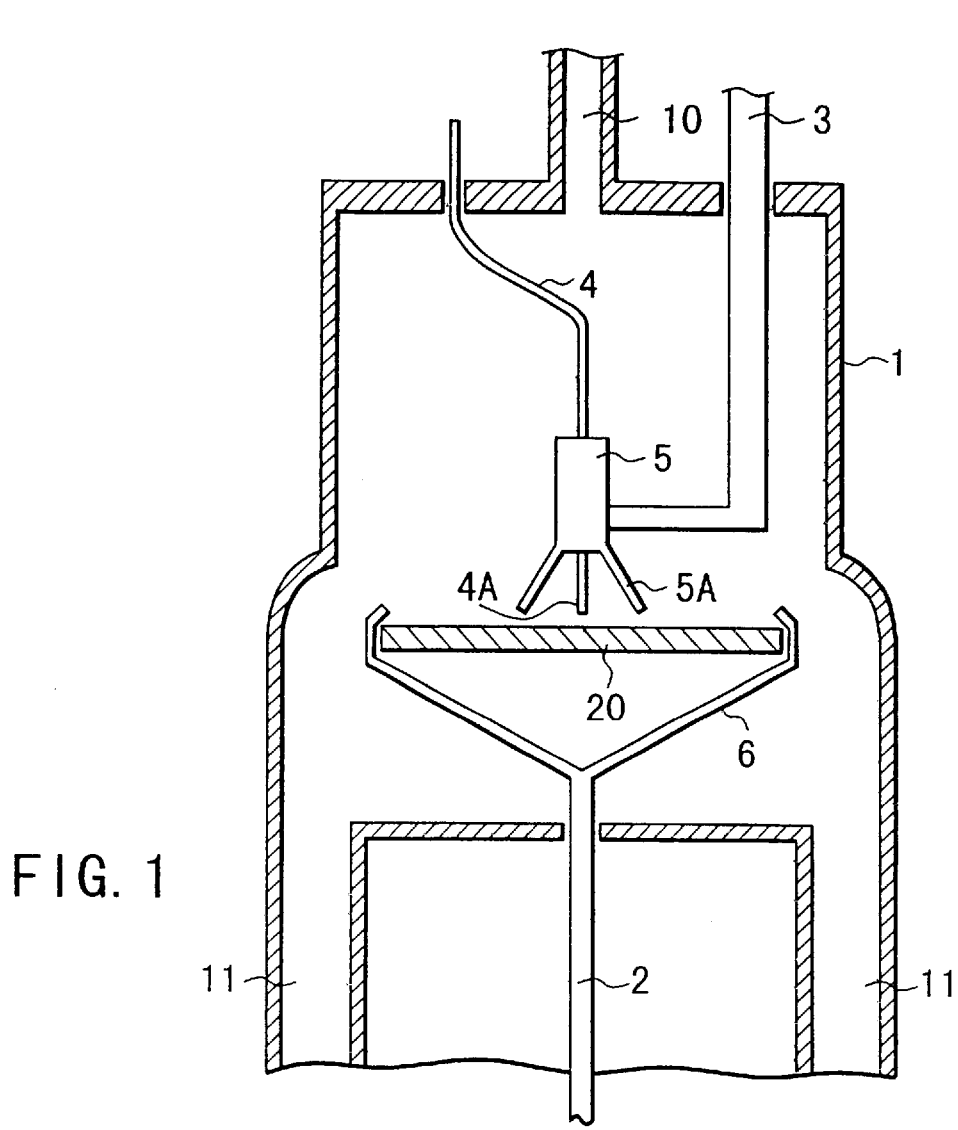
FIG. 1 represents a schematically sectional view illustrating a main portion of a sheet form semiconductor substrate cleaning apparatus according to a first embodiment of this invention wherein a semiconductor substrate is placed inside the cleaning apparatus.

This invention will be further illustrated with reference to preferable embodiments shown in the drawings.

(First Embodiment)

The semiconductor substrate cleaning apparatus according to a first embodiment of this invention will be explained in detail with reference to FIG. 1.

FIG. 1 represents a schematically sectional view illustrating a main portion of a sheet form semiconductor substrate cleaning apparatus according to a first embodiment of this invention wherein a semiconductor substrate is placed inside the cleaning apparatus. The reference number 1 denotes the chamber (made of polyvinyl chloride for instance) of a semiconductor substrate cleaning apparatus, which is cylindrical in configuration with the top and bottom surfaces thereof being closed. A rod-like substrate holder 2 (made of polyvinyl chloride for instance) is disposed inside the chamber 1 in such a manner that it passes through a central portion of the bottom of the chamber 1 while keeping an airtightness between the bottom of the chamber 1 and the substrate holder 2 and at the same time, ensuring the rotatability of the substrate holder 2 in relative to the bottom of the chamber 1. This substrate holder 2 is connected at one end thereof with a rotating mechanism (not shown) which is disposed outside the chamber 1 thereby enabling the substrate holder 2 to be revolved at a high speed. The other end of the substrate holder 2 which is disposed inside the chamber 1 is connected with a substrate-mounting jig 6 for detachably mounting a semiconductor substrate that can be effected by the manipulation of lower portion of the substrate holder 2. Namely, it is designed such that a semiconductor substrate 20 can be horizontally mounted on the substrate-mounting jig 6 with the top surface (a device-forming surface) of the semiconductor substrate 20 being directed upward and revolved through the rotation of the substrate holder 2.

This semiconductor substrate 20 can be introduced into the chamber 1 from a load lock chamber (not shown) disposed beside and communicated with the chamber 1 and can be taken out of the chamber 1 without disrupting the atmosphere inside the chamber 1.

Further, a nozzle 4 which is formed of a fine stainless steel tube, a fine Teflon tube or a fine silicon nitride tube for jetting a high pressure water jet is disposed inside the chamber 1 in such a manner that the tip end 4A of the nozzle 4 is positioned over and slightly spaced away from the top surface of the semiconductor substrate 20. The nozzle 4 is fixingly retained, through a portion near the tip end 4a thereof, by a nozzle frame 5 which is made of polyvinyl chloride for instance.

Additionally, an umbrella type cover member 5A (made of Teflon for instance) is attached to the lower fringe of the nozzle frame 5 so as to encircle the nozzle 4 projected from the central bottom portion of the nozzle frame 5, thereby making it possible to prevent the splashing of the mist to be generated from the high pressure water jetted from the nozzle 4.

On the other hand, a rod-like nozzle-supporting arm 3 which is coated with polyvinyl chloride for instance is disposed inside the chamber 1 in such a manner that it passes through an upper peripheral surface portion of the chamber 1 while ensuring an air-tightness between the upper peripheral surface portion of the chamber 1 and the nozzle-supporting arm 3 and at the same time, ensuring the rotatability of the nozzle-supporting arm 3 in relative to the upper peripheral surface portion of the chamber 1. This nozzle-supporting arm 3 is connected at an upper end thereof with a rotating mechanism (not shown) which is disposed outside the chamber 1 thereby enabling the nozzle-supporting arm 3 to be revolved at a predetermined range of angle. Further, a lower portion of the nozzle-supporting arm 3 which is disposed inside the chamber 1 is L-shaped with the distal end thereof being directed toward the center of the chamber 1 and fixed to the nozzle frame 5.

According to this cleaning apparatus, the nozzle arm 5 can be stably retained by the nozzle-supporting arm 3, and when the nozzle-supporting arm 3 is rotated at a predetermined angle, the nozzle frame 5 is enabled to scan an entire area along the diametral direction of the semiconductor substrate 20, and when the substrate holder 2 is additionally rotated, the entire surface of the semiconductor substrate 20 can be allowed to come close to the tip end 4A of the nozzle 4.

The nozzle 4 (which is formed of a fine stainless steel tube, a fine Teflon tube or a fine silicon nitride tube) is designed to function also as a feeding pipe for feeding water of high pressure. Further, while ensuring air tightness in relative to the chamber 1, the nozzle 4 is extended out of an upper portion of the chamber 1, leaving a sufficient length thereof inside the chamber 1 so as enable it to follow the rotation of the nozzle-supporting arm 3. One end portion of the chamber 1 is connected with a high pressure water feeding source (not shown) thereby making it possible to continuously feed a high pressure water.

A gas inlet port 10 is formed at a central portion of the upper surface of the chamber 1 thereby making it possible to feed an inert gas such as nitrogen gas into the chamber 1. On the other hand, an exhaust port 11 connected with an outside exhauster (not shown) is formed at a lower portion of the chamber 1 which is lower than the mounting portion of the semiconductor substrate 20, thereby allowing an inert gas fed through the gas inlet port 10 to be discharged from this exhaust port 11. It is possible with this construction to pass an inert gas through the chamber 1 at the occasion of cleaning the surface of the semiconductor substrate 20 by making use of an ejection of a high pressure water, thereby effectively guide and move a mist that has been generated from the high pressure water toward the exhaust port 11 together with the introduced inert gas. At the same time, the high-pressure water can be also effectively discharged together with the inert gas.

Next, the method of cleaning the surface of a semiconductor substrate by making use of the aforementioned apparatus will be explained.

First of all, the semiconductor substrate 20 is transferred from the load lock chamber (not shown) into the chamber 1, setting it close to the tip end 4A of the nozzle 4 (FIG. 1).

Then, the substrate holder 2 is rotated at a speed of 100 to 1,000 rpm for instance, and the nozzle supporting arm 3 is also moved at a sliding speed of 10 to 50 mm/sec, and at the same time, nitrogen gas is introduced into the chamber 1 from the gas inlet port 10 at a flow rate of about 10 slm and then discharged from the exhaust port 11 to thereby form a gas flow inside the chamber 1. Then, a high pressure water is allowed to jet from the tip end 4A of the nozzle 4 at a flow rate of 1 to 10 sccm so as to clean the surface of the semiconductor substrate 20.

In this case, if a high-frequency wave about at 1.6 MHz for instance is impressed in advance on the high pressure water, the high-frequency will be propagated to the surface of the semiconductor substrate 20 at the moment of jetting a high pressure water, whereby the fine dust that has been adhered onto the surface of the semiconductor substrate 20 would be vibrated and excited, thus causing the fine dust to float upward and enabling the fine dust to be easily removed by the high pressure water. As a result, a clean surface of the semiconductor substrate 20 can be obtained.

In this case, the high pressure water is jetted as a jet water flow from the tip end 4A of the nozzle 4 at the occasion of jetting the high pressure water, the jet water flow being impinged against the surface of the semiconductor substrate 20 and then reflected therefrom, thus generating a large quantity of steam mist.

In the case of this embodiment, this steam mist is caused to impinge upon the hydrophobic surface of Teflon formed on the inner wall of the umbrella type cover member 5A, thereby losing the energy thereof and forming a water drop as it is. The water drop thus formed is then allowed to fall on the surface of the semiconductor substrate 20. As a result, there is little possibility that the steam mist is adhered in a state of mist to the surface of the semiconductor substrate 20.

Figure 2:
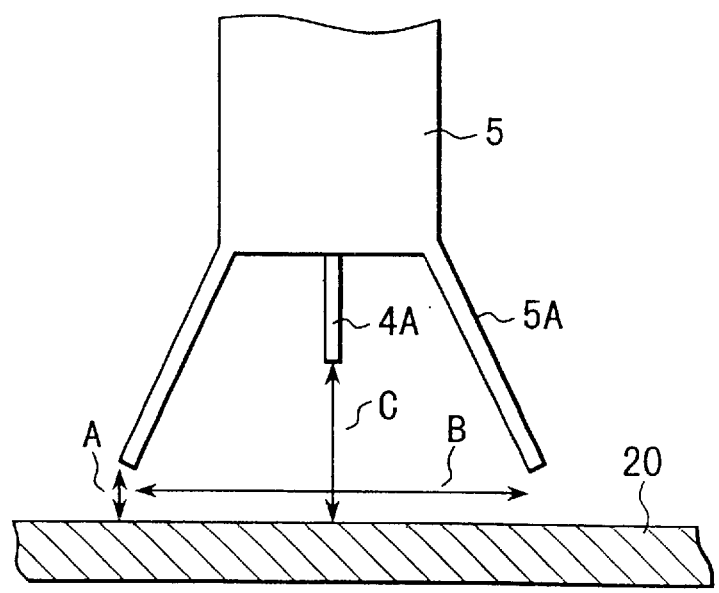
FIG. 2 is an enlarged schematically view showing an umbrella type cover member 5A and a region around the cover member 5A.

FIG. 2 shows an enlarged schematic view of an umbrella type cover member SA and a region around the cover member 5A. In FIG. 2, "A" represents a distance between the lower end of the umbrella cover member SA and the surface of the semiconductor substrate 20, "B" denotes the length of the opening of the lower end of the umbrella cover member 5A, and "C" is a distance between the tip end 4A of the nozzle 4 and the surface of the semiconductor substrate 20.

Figure 3:
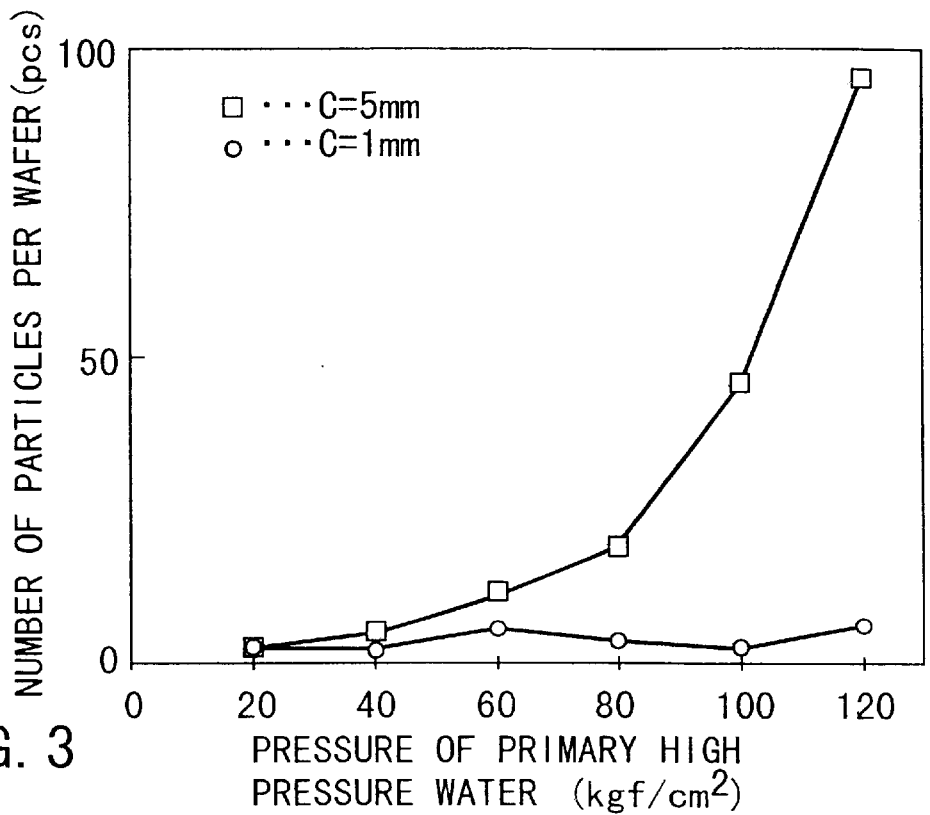
FIG. 3 is a graph illustrating a relationship between the pressure of a high pressure water (the pressure of a primary high pressure water) at the moment of cleaning a semiconductor substrate (indicated by the abscissa) and the number of dust that was adhered onto a 8-inch semiconductor substrate (the number of particles per wafer) after cleaning and drying steps (indicated by the ordinate), wherein the distance A between the lower end 5A of the umbrella type cover member 5A and the surface of the semiconductor substrate 20 was defined as the height of nozzle, and the height of nozzle was set to 5 mm or 1 mm.

FIG. 3 illustrates a relationship between the pressure of a high pressure water (the pressure of a primary high pressure water) at the moment of cleaning a semiconductor substrate (indicated by the abscissa) and the number of dust that was adhered onto a 8-inch semiconductor substrate (the number of particles per wafer) after cleaning and drying steps (indicated by the ordinate), wherein the distance A between the lower end 5A of the umbrella type cover member 5A and the surface of the semiconductor substrate 20 was defined as the height of nozzle, and the height of nozzle was set to 5 mm or 1 mm.

As seen from FIG. 3, when the height of the nozzle was set to 1 mm, the number of particles per wafer (due to re-adsorption) could be controlled to as low as about 5 or less even if a high pressure water of about 100 kgf/cm$^2$ was employed. It was found however that if the height of the nozzle was set to 5 mm, the number of particles per wafer was as much as about 10, which was larger than the result where the height of the nozzle was set to 1 mm even if the pressure of the high pressure water was set to 50 kgf/cm$^2$.

Figure 4:
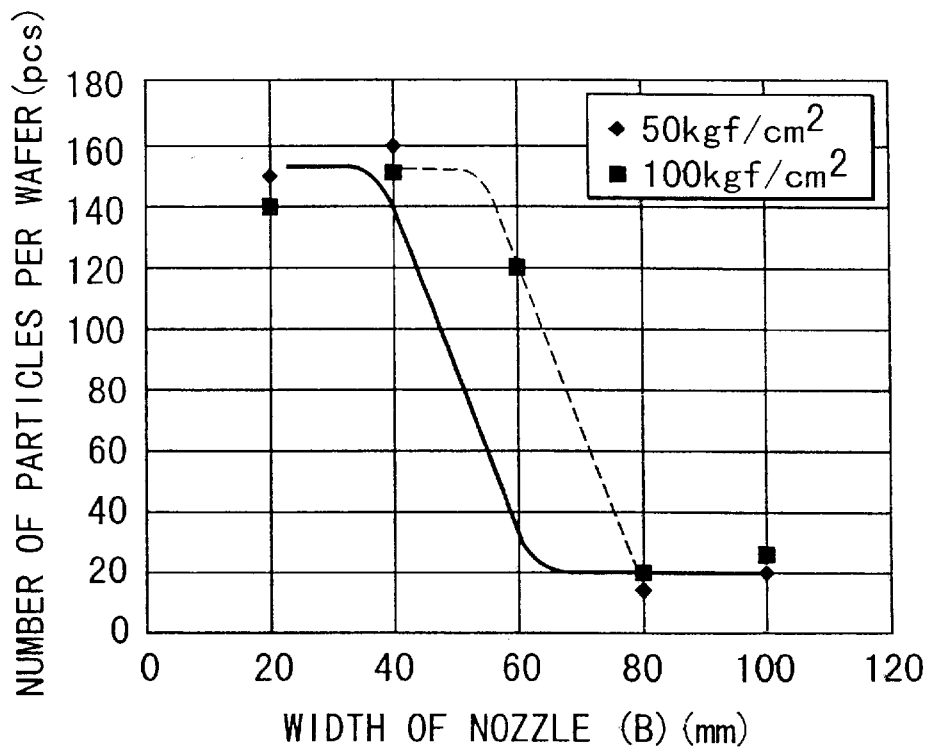
FIG. 4 is a graph illustrating a relationship between the length B of the opening (the width B of nozzle) at the lower end of the umbrella type cover member 5A, which was varied from 20 mm to 100 mm and the number of particles that were left adhered onto one wafer after cleaning and drying steps thereof, wherein the pressure of high pressure water applied to the semiconductor substrate 20 was set to 50 kgf/cm$^2$ or 100 kgf/cm$^2$.

On the other hand, FIG. 4 illustrates a relationship between the length B of the opening (the width B of nozzle) at the lower end of the umbrella type cover member SA, which was varied from 20 mm to 100 mm and the number of particles that were left adhered onto one wafer after cleaning and drying steps thereof, wherein the pressure of high pressure water applied to the semiconductor substrate 20 was set to 50 kgf/cm$^2$ or 100 kgf/cm$^2$. By the way, the height "A" of the nozzle in this case was 1 mm. As apparent from this FIG., although there may be some degree of difference depending on the pressure of the high pressure water, it was found that if the width of the nozzle was set to 80 mm or more, the number of residual particles per wafer could be stably controlled to a small number, but if the width of the nozzle was set to 40 mm or less, the number of residual particles per wafer would inevitably be greatly increased.

Next, a modified example of the semiconductor substrate cleaning apparatus according to this embodiment will be explained with reference to the drawings.

Figure 5:
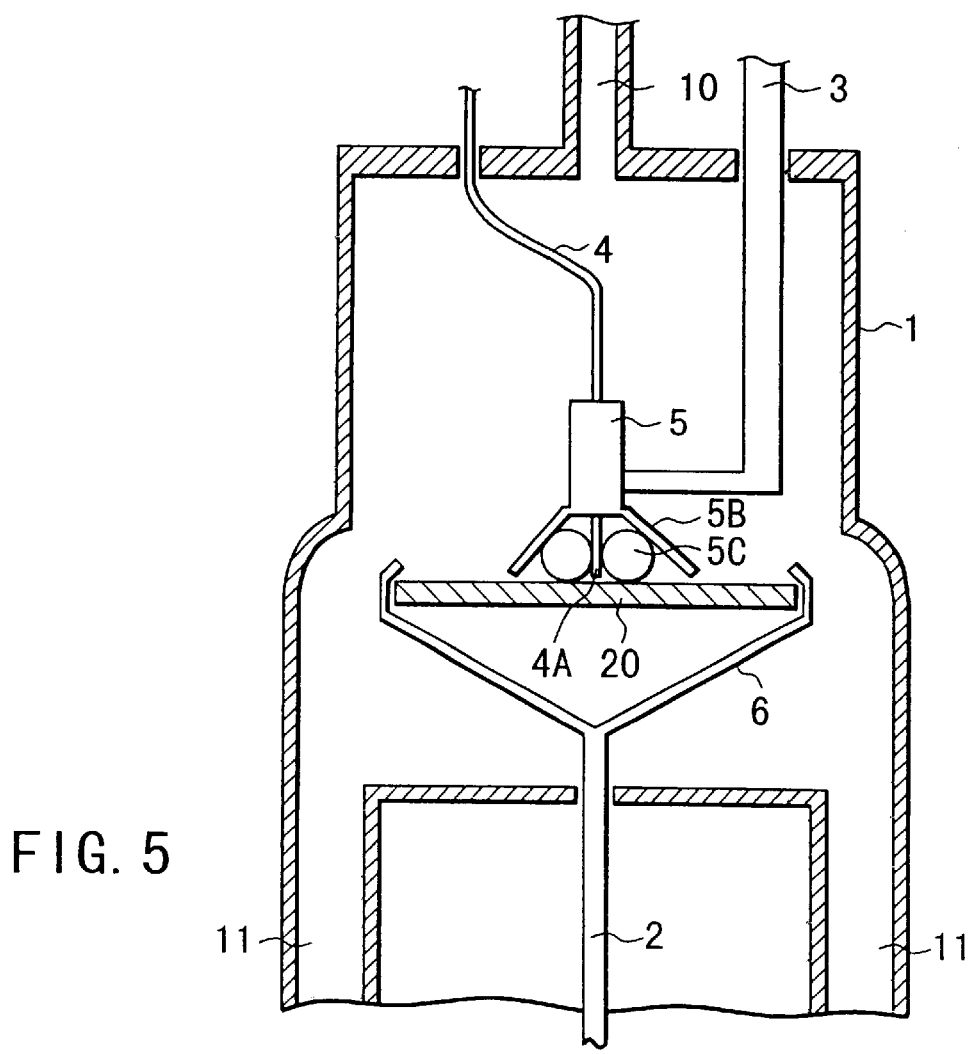
FIG. 5 is a schematically sectional view illustrating a modification of the first embodiment of this invention shown in FIG. 1.
Figures 6A, 6B, 6C, 6D:
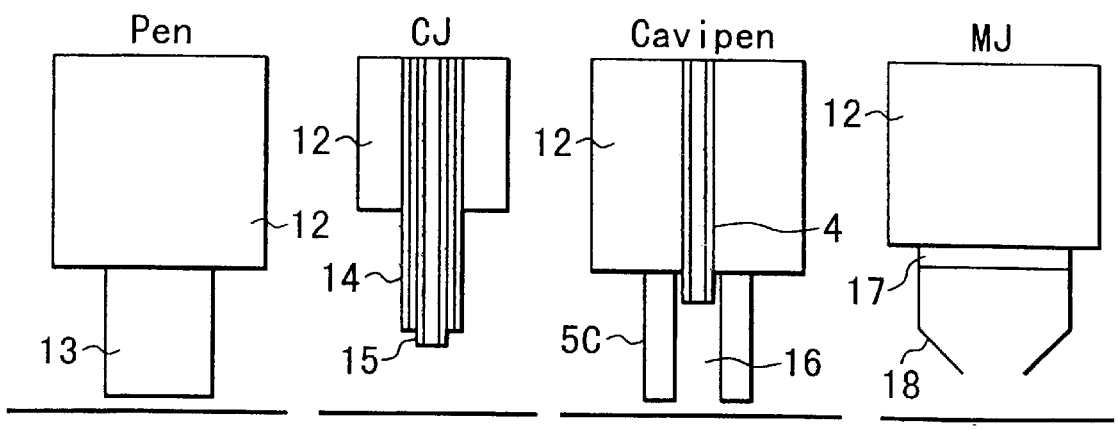
FIGS. 6A to 6D are schematically sectional views illustrating the nozzles of Pen, CJ, Cavipen and MJ which were employed in an experimental module according to a second embodiment.

FIG. 5 shows a schematic sectional view illustrating a modification of this embodiment. In this FIG. 5, the same portions as those of the above first embodiment are indicated by the same numeral or mark thereby omitting the explanation thereof in this embodiment.

In this modified example, a sponge fixing jig 5B made of Teflon was substituted for the umbrella type cover member 5A employed in the aforementioned first embodiment. This sponge fixing jig 5B is provided therein with a pencil sponge 5C (made of Teflon or polyvinyl chloride for instance) having a doughnut-like configuration and fixingly arranged to encircle the tip end 4A of the nozzle 4, the bottom surface of the pencil sponge 5C being contacted with the surface of the semiconductor substrate 20.

When the cleaning of the surface of the semiconductor substrate 20 is to be performed using an apparatus according to this modified example, since the cleaning can be performed while the pencil sponge 5C is allowed to contact with the surface of the semiconductor substrate 20, there is much less possibility that the mist can be splashed outside the sponge fixing jig 5B.

Further, since the pencil sponge 5C is contacted with the surface of the semiconductor substrate 20, the distance between the sponge fixing jig 5B and the semiconductor substrate 20 can be suitably adjusted within a wide range of from the position where the pencil sponge SC is contacted with the surface of the semiconductor substrate 20 to the position where the sponge fixing jig SB is contacted with the surface of the semiconductor substrate 20.

Figure 22:
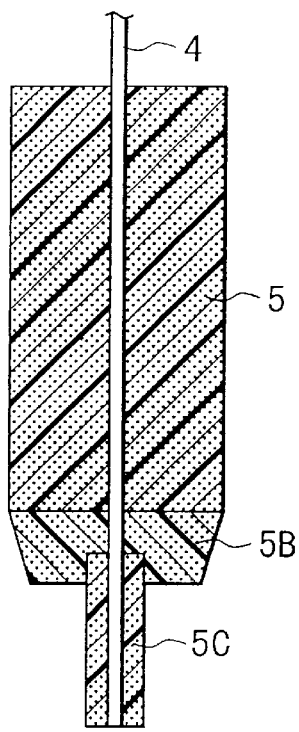
FIG. 22 is a cross-sectional view of the main portion of the nozzle tip according to a modified example of the first embodiment.

In this case, the pencil sponge 5C may be of a cylindrical configuration as shown in FIG. 22 where a main portion of the tip end of the nozzle is shown as a longitudinal sectional view. In this FIG. 22, the same portions as those of FIG. 5 are indicated by the same numeral thereby omitting the explanation thereof. If the pencil sponge 5C is constructed in this manner, the contacting area of the pencil sponge 5C with the surface of the semiconductor substrate 20 would be increased, thus further minimizing the possibility that the mist can be splashed outside the sponge fixing jig 5B even if a small gap is generated between the distal end of the pencil sponge 5C and the surface of the semiconductor substrate 20.

When the sponge-fixing jig 5B is constructed in this manner, the possibility that the mist can be splashed outside the sponge-fixing jig 5B would be further minimized.

As for the material of the pencil sponge 5C, it is not limited to polyvinyl chloride.

(Second Embodiment)

Next, the cleaning method according to a second embodiment of this invention where the aforementioned pencil sponge 5C is employed will be explained in detail.

Experiments to compare the Cavipen cleaning method according to this invention with the conventional cleaning method based on the Pen, with the conventional cleaning method based on the CJ and with the conventional cleaning method based on the MJ, as well as experiments to investigate various parameters giving an influence to the Cavipen cleaning method were performed in the following procedures.

Figure 34:
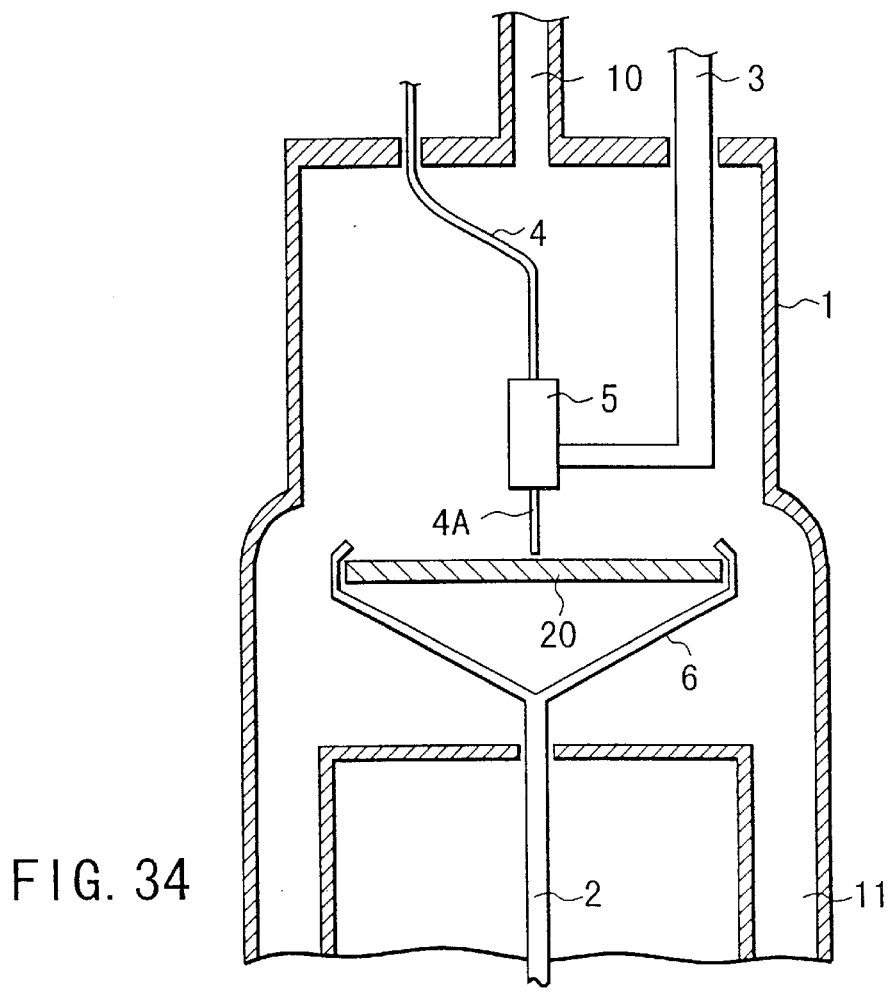
FIG. 34 represents a schematically sectional view illustrating a main portion of a sheet form semiconductor substrate cleaning apparatus according to the prior art wherein a semiconductor substrate is placed inside the cleaning apparatus.
Figure 35A:
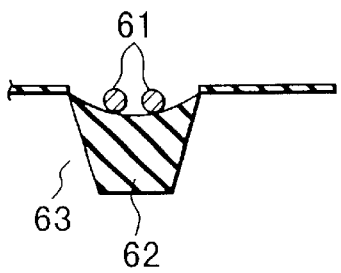
FIGS. 35A to 35C are diagrams illustrating a state where polishing particles were left remained on the polished surface of a wafer after the flattening step according to the CMP.
Figure 35B:
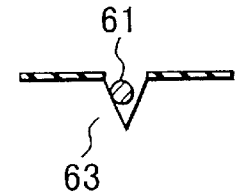
Figure 35C:
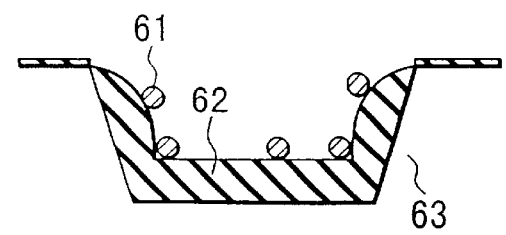

1) Apparatus for the Experiments:

Two R/S modules, a single Pen module (used also as a Cavipen module), a single MJ module and a single CJ module were employed. Each of these modules was essentially the same in construction as the substrate cleaning apparatus shown in FIG. 34, and the type of the nozzle was varied depending on the kind of cleaning method.

FIGS. 6A, 6B, 6C and 6D show a schematic sectional view of each of the nozzles for these Pen, CJ, Cavipen and MJ which were employed in these experimental modules, respectively. In FIGS. 6A, 6B, 6C and 6D, the reference numeral 12 represents a nozzle jig, 13 a columnar pencil sponge (made of PVA), 14 a low pressure water nozzle, 15 a high-pressure water nozzle, 5C a pencil sponge (made of PVA) having a hollow portion, 16 the hollow portion of the pencil sponge, 17 an oscillator for generating a high-frequency wave, and 18 a tip end of Teflon nozzle.

In the case of the Pen, contact cleaning is performed by scanning the cleaning surface by making use of a rotating pencil sponge 13.

In the case of the CJ, a high-pressure water (10 to 110 kgf/cm$^2$) is fed into the high pressure nozzle 15, and concurrently, a low pressure water (1 to 2 kgf/cm$^2$) is fed into the low pressure nozzle 14, these high and Was low pressure waters being jetted against a cleaning surface. As a result, a large number of cavities are generated at an interface between the jetted high-pressure water and low-pressure water.

In the case of the Cavipen, the sponge made of PVA employed in the Pen is replaced by the pencil sponge 5C formed of a sponge having a hollow portion 16 with an inner diameter of 5 to 8 mm. Inside this pencil sponge 5C, only the nozzle 4 for jetting a high-pressure water is mounted therein. Cavities are generated by blowing a high pressure water into a liquid stayed in the hollow portion 16 of the pencil sponge 5C.

By the way, in the case of the high pressure nozzle 15 and nozzle 4 which are designed to blow out a high pressure water, there are parameters such as the diameter of nozzle (D=0.3 mm, 0.4 mm), the height of nozzle from the wafer (L=3, 5, 7, 9, 11 mm).

In the MJ, frequencies of 200 kHz, 400 kHz, 700 kHz, 1 MHz and 1.5 MHz are employed.

2) Samples:

As for the wafer (semiconductor substrate), an 8-inch bare Si wafer was employed as a flat wafer for a reference (for comparison). As a wafer, an 8-inch Si wafer having an L/S groove (hereinafter referred to as a recessed wafer) which was formed by means of RIE was employed. The depth of trench (groove) was 5,000 angstroms and the minimum L/S was 1 $\mu$m/3 $\mu$m. A TEOS film, a poly-Si film or an SiN film each having a thickness of 200 to 2,000 angstroms were formed on the recessed Si wafer by means of an LP-CVD method.

As for the particle employed for the assessment of cleaning effect, a high-purity alumina (having a diameter in the range between 0.1 to 3 $\mu$m, 0.7 $\mu$m; Admatics Co., Ltd.) was employed, which was dispersed in an ultrapure water, thereby preparing a standard particle solution.

3) Procedures for the Assessment of Cleaning:

As for the apparatus for the assessment, SP1 or SFS6200 (KLA-Tenchor Co, Ltd.) was employed as a particle counter for the bare Si wafer, and AIT-8000 (KLA-Tenchor Co, Ltd.) was employed as a particle counter for the recessed wafer. The initial quantity of particles on each wafer was measured using a defect inspection instrument. Thereafter, for the purpose of coating particles on the surface of wafer, the wafer was kept rotated at a speed of 100 rpm in the R/S module, and at the same time, ultrapure water was jetted from the fixed nozzle toward the surface of the wafer to keep the wettability of the surface of wafer, after which about 3 cc of the standard particle solution was dropped on only the surface of the wafer thereby to perform a pure water roll scrub cleaning for 20 seconds.

Thereafter, in the case of experiment under dry condition, the wafer was spin-dried under the condition of the MJ module, the dried wafer being hereinafter referred to as a dry sample. On the other hand, in the case of experiment for the cleaning assessment of the particles adsorbed on the wafer under a wet condition without drying the wafer, the wafer was transferred as it is to each cleaning module to perform the cleaning assessment. The wafer thus transferred is hereinafter referred to as a wet sample. In the case of the dry sample, the initial value of the adsorption of the standard particle was measured at first by making use of SP1, SFS6200 and AIT, and then, the cleaning assessment of the dry sample was performed according each cleaning module. After the dry sample and the wet sample were cleaned according to each cleaning assessment, the final residual value of particle was measured by SP1, SFS6200 and AIT. The chemical solution employed in the assessment of cleaning was a diluted aqueous solution of ammonia of room temperature, and the hydrogen ion concentration (pH) as a main cleaning condition was set to 10. On the other hand, in the experiment to investigate the effect of dilution (pH dependency), the pH was set within the range of 7 to 10.

4) Evaluation Method of Frequency Characteristics:

The frequency characteristics evaluation relating to cavities generated in the Cavipen was performed, the result of which was compared to MJ (1.5 MHz) being employed as a reference. A hole having a diameter of 5 mm was opened in a disc made of SUS and having the same diameter as that of the wafer, and a sound pressure sensor (Toyo Technica Co., Ltd.) having a diameter of 5 mm was inserted into the hole from the reverse surface of the disc, rendering the surface of the sound pressure sensor to coincide with the surface of the disc. Then, the MJ or Cavipen was positioned right above the sound pressure sensor and then, a sonic wave was emitted over the sound pressure sensor under each cleaning condition without swinging the nozzle. The analysis of the frequency characteristics was performed by making use of a digital analyzer.

[Results of the Experiment]

First of all, the results of MJ particle cleaning assessment constituting the standard of assessment will be illustrated, wherein the assessment of the frequency dependency was limited to dry samples.

FIG. 7 illustrates the effect of cleaning (the removal ratio: %) as various frequency were applied in the cleaning of the bare Si wafer. The conditions for cleaning were 100 rpm in the rotational speed of the wafer, 5 mm/sec in the scanning speed of nozzle, three times in the number of scanning, and 40 to 45 degrees in the angle of nozzle with the wafer surface. Since the effect of cleaning particles generally increases as the output power of the ultrasonic is increased, it was required, for the purpose of simply comparing only the frequency characteristics, to control the output at each frequency employed in this removal assessment in such a way that the peak amplitude voltage at each frequency was set to 270 mV except the frequency of 1.5 MHz wherein the peak amplitude voltage was set to 370 mV.

As a result, it was found that the cleaning effect is dependent on the frequency in all of the particles containing an aggregated particle of 0.2 to 10 micrometer in diameter. In particular, it was found that frequencies in the order of several hundreds kHz such as 200 to 700 kHz were more excellent in cleaning effect as compared with the frequencies in the order of MHz.

FIG. 8 illustrates the time dependency of the cleaning effect under the conditions wherein frequencies of 200, 400, 500 and 700 kHz were applied to the same area (a circle having a diameter of 40 mm) of a bare Si wafer, and the nozzle was fixed directing it to the center of the wafer (the number of residual particles after cleaning/a circle having a diameter of 40 mm). It was recognized in any of the frequencies that as the irradiation time was increased, the cleaning effect was increased (the number of residual alumina particles was decreased).

However, when the cleaning was performed under the irradiation of various frequencies while the irradiation time was fixed to 20 seconds, a frequency band ranging from 400 to 700 kHz was found most excellent in cleaning efficiency.

Next, as a criterion for assessing the cleaning effect of the recessed wafer, a sample of the recessed wafer on which an SiN film was deposited as a surface film was tested to investigate the effect of cleaning alumina particle under the condition wherein the frequency in the MJ was variously changed. FIG. 9 shows a relationship between the frequencies applied and the removal ratio of the particles that was obtained as a result of the aforementioned test. When the condition of residual particles before and after the cleaning was investigated by making use of AIT-8000, it was found that even in the case of the recessed wafer, the most excellent cleaning effect could be obtained when a frequency was set to about 400 kHz.

It is commonly considered that the mechanism of the removal of particles by making use of ultrasonic is relevant to the acceleration energy of ultrasonic, a rectilinear flow energy and an energy generated by breakdown of a cavitation. As mentioned above, although the relationship between the frequency of ultrasonic wave and the particle size that can be cleaned out is not yet clarified, it is empirically considered that the washable particle size is inversely proportional to the frequency as it is based on the criterion that particles of 3 μm or more can be removed with a frequency of 28 kHz. Namely, the washable particle size can be represented by the following equation:

Washable particle size=3×28×10$^3$ (Hz)/Frequency employed (f)

According to this equation, particles of about 0.16 μm or more can be cleaned out by making use of a sonic wave at 500 kHz, while particles of about 0.08 μm or more can be cleaned out by making use of a frequency of 1 MHz. Therefore, if it is desired to clean out spherical particles having an average particle diameter of about 0.7 μm (0.1 (minimum)–3 μm (maximum)) as was employed in this case, it is generally considered that a frequency in the order of MHz is higher in detergency as compared with a frequency in the order of kHz in the removal of particles of every sizes. In fact however, an ultrasonic of several hundreds kHz exhibited a higher detergency as seen from the above experimental results.

It will be seen from the above experimental results that for the purpose of removing alumina particles of aforementioned size, the cleaning action by the cavity which is more likely to be generated in a cleaning liquid as an ultrasonic in lower frequency band is applied thereto is more effective. Namely, in the case of the MHz band cleaning wherein the acceleration energy as well as the rectilinear flow energy becomes a main factor, it may be difficult to remove, by means of only physical force, the particles that are adsorbed on the surface of wafer after the CMP. Namely, if it is desired to enhance the cleaning effect in the MHz band cleaning, a lift-off action utilizing a chemical etching of a film per se on which the particles are adsorbed should preferably be employed together with the physical means.

Meanwhile, the problem involved in the cleaning utilizing ultrasonic is a damage to a wafer. Even in the case of a batch type wafer cleaning apparatus, a problem of damage to a wafer should be considered. The damage to a wafer in this case is mainly the collapsing (skipping) of a fine pattern in ULSI, which brings about a serious problem even in a 0.25 μm device. This problem of damage is a phenomenon that has been made clear, as the pattern has become increasingly finer. Thus, this problem will be raised mainly because the size of pattern is almost the same as that of the particles to be cleaned.

In an attempt to solve the problem of the skipping of pattern, there have been proposed various methods, e.g. a method to decrease the output power of MHz-frequency wave to such a degree that would not cause the generation of the skipping of pattern at a sacrifice of deteriorating the particle removal efficiency or the essential object of the cleaning, or a method of effectively generating only the cavities assumably influencing the removal of particles by introducing a gas such as oxygen, nitrogen or argon into a cleaning chemical solution or ultrapure water, thereby weakening the accelerating energy of ultrasonic or the rectilinear flow energy. However, since a method of effectively removing only particles without giving a damage to a wafer is not yet clearly established, it is difficult at present to apply the ultrasonic cleaning procedure to the CMP post-cleaning.

[Cavipen Cleaning Method]

The Cavipen cleaning method according to this invention can be performed as follows.

FIG. 10 shows a schematic sectional view illustrating one example of an apparatus for executing the Cavipen cleaning method according to this invention. This apparatus is almost the same as that of FIG. 1 so that the same members and portions which are the same as those of FIG. 1 will be identified by the same reference numerals, thereby omitting the explanation thereof.

First, referring to FIG. 10, the semiconductor substrate 20 is transferred from the load lock chamber (not shown) into the chamber 1, setting it close to the tip end 4A of the nozzle 4.

Then, the substrate holder 2 is rotated at a seed of 100 to 1,000 rpm for instance, and the nozzle supporting arm 3 is also moved at a sliding speed of 10 to 50 mm/sec., and at the same time, nitrogen gas is introduced into the chamber 1 from the gas inlet port 10 at a flow rate of about 10 slm and then discharged from the exhaust port 11 to thereby form a gas flow inside the chamber 1. Then, a high pressure water pressurized at a pressure of 30 kgf/cm$^2$ to 110 kgf/cm$^2$ for instance is jetted from the tip end 4A of the nozzle 4 at a flow rate of 1 to 10 sccm so as to clean the surface of the semiconductor substrate 20. In this embodiment, the tip end 4A of the nozzle 4 is projected into the hollow portion 16 of the pencil sponge 5C. Further, a rinse liquid may be fed to the surface of the semiconductor substrate 20 from a rinse liquid supply pipe (not shown) during the cleaning step so as to keep the surface of the semiconductor substrate 20 at a wet condition.

In this case, when a high-pressure water jetted from the tip end 4A of the nozzle 4 is contacted with a resting water or a low-pressure water stayed inside the hollow portion 16 of the pencil sponge 5C, a large number of cavities are generated. At the moment when these cavities are collapsed, high frequency waves are generated and propagated to the surface of the semiconductor substrate 20. Depending on the frequency thereof, the high-frequency wave causes vibration and excitation of fine dusts that have adhered onto the surface of the semiconductor substrate 20, thereby allowing the fine dusts to float upward and to be removed by the action of the high pressure water. As a result, a clean surface of the semiconductor substrate 20 can be obtained.

[Comparison of the Cleaning Effect Between the Cavipen Cleaning Method and Other Cleaning Methods]

A test for comparing the particle removal effect/cleaning effect of the Cavipen cleaning method with those of other cleaning methods was performed. In this test, a recessed wafer having a TEOS film as a surface film and further coated with the aforementioned standard particle solution (hereinafter referred to as "TEOS recessed wafer") was employed as a sample for measuring and comparing the cleaning effects of the chemical cleaning, the Pen cleaning and Cavipen cleaning. In this measurement, only the cleaning using a diluted aqueous solution of ammonia was performed in the case of the chemical cleaning, the Pen cleaning was performed simultaneously with the cleaning using a diluted aqueous solution of ammonia in the case of the Pen cleaning, and the Cavipen cleaning was performed simultaneous with the cleaning using a diluted aqueous solution of ammonia in the case of the Cavipen cleaning.

The measurement of cleaning effect was also performed on the TEOS recessed wafer employed as a reference (free from a coating of standard particle) for the purpose of comparison. The cleaning of these samples was performed while they are being wet-transferred.

In the case of the TEOS recessed wafer where only the chemical cleaning was applied thereto, the residual particles were left remained all over the surface. In the case of the TEOS recessed wafer where the Pen cleaning was applied thereto simultaneous with the chemical cleaning, the residual particles were left remained all over the surface though the quantity of the residual particles was much less than that of the TEOS recessed wafer where only the chemical cleaning was performed. In the case of the TEOS recessed wafer where the Cavipen cleaning was applied thereto simultaneous with the chemical cleaning, the quantity of residual particles left remained thereon was almost as little as that of the reference.

FIG. 11 shows the results of the aforementioned measurement. As apparent from FIG. 11, when a wafer which had been subjected to a pure roll scrubbing using the standard particle was cleaned by means of only the chemical cleaning, particles in the order of tens of thousands were left adsorbed thereon. Namely, it was impossible to substantially remove the alumina particles by means of only the chemical cleaning wherein a wafer was rinsed by making use of a diluted aqueous ammonia solution after the wet-transferring. However, since this treatment using a diluted aqueous ammonia solution was performed at room temperature, any substantial etching of an oxide film by the alkaline solution could not be recognized. If the temperature of cleaning treatment of a wafer was raised up to about 70° C. for performing an SCI treatment in the RCA cleaning which enables to perform an etching of several angstroms (measured as a thermal oxide film), the removal of particles may be expected more or less owing to the effect of lift-off.

It has been found that, by performing the Cavipen cleaning in addition to the rinsing using a diluted aqueous ammonia solution, the residual particles can be reduced to the same extent as the initial defective level (a state before coating the standard particle solution) where a pure water roll scrubbing using the standard particle was not yet performed. This is because a contact cleaning by means of the Pen cleaning and a non-contact cleaning by making use of the cavity were concurrently performed in the Cavipen cleaning, thereby to remove the particles adsorbed inside the recessed portion. However, in the case that the Pen cleaning (which is a physical cleaning) was performed in addition to the rinsing using a diluted aqueous ammonia solution, about 10% of alumina particles was left remained on the wafer though about 90% of alumina particles could be removed. This indicates the fact that though it was possible to remove the alumina that was adsorbed on the upper portion of the groove portion where the pencil sponge could be contacted with, the particles adsorbed on the interior (or the bottom portion) of the groove portion could not be removed by the pencil sponge cleaning.

[The Hard Parameter Dependency of the Cavipen Cleaning Method]

Figure 12:
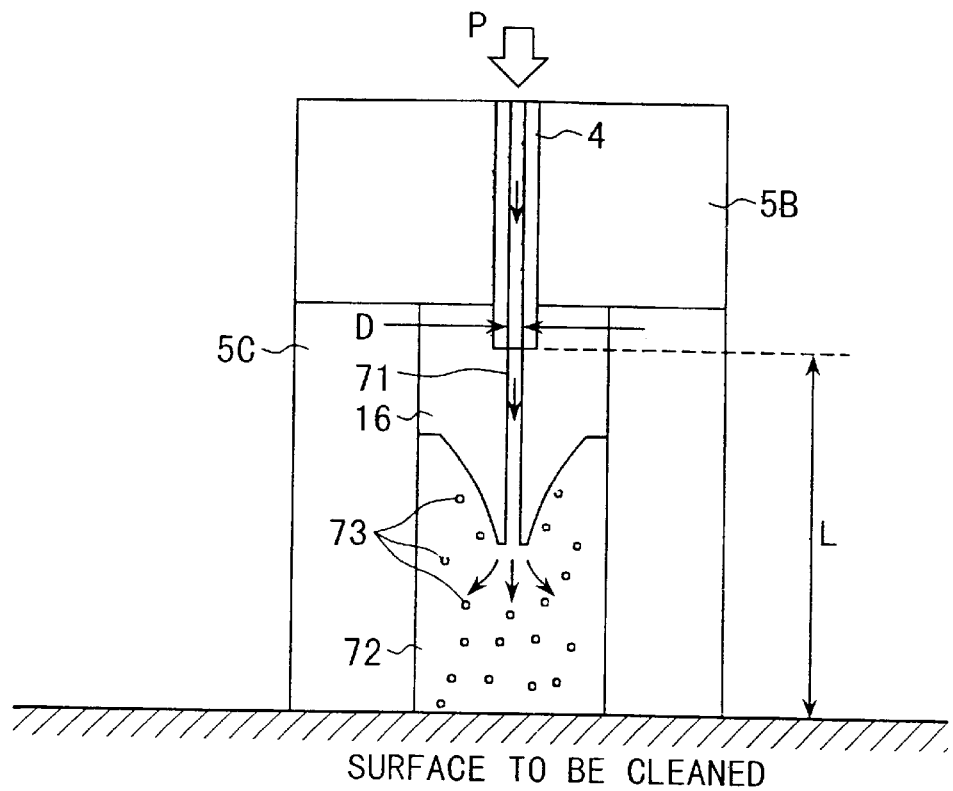
FIG. 12 is a diagram for schematically illustrating the principle of the generation of cavity in the Cavipen cleaning method according to this invention.

By the way, the principle for generating cavity in the Cavipen cleaning method according to this invention may be attributed to the following facts. FIG. 12 shows a diagram for illustrating the principle of the generation of cavity. In FIG. 12, 5B represents a nozzle jig, 4 a high pressure water nozzle, 5C a pencil sponge, 71 a high speed water column blown out of the nozzle 4, 72 a low speed or still water, 73 a cavity, D the inner diameter of the nozzle, L a height from a wafer to the lower end of the nozzle, and P a pressure of the high pressure water in the nozzle.

Referring to FIG. 12, when a water of high pressure (or a cleaning chemical solution, hereinafter referred to simply as "water") is fed to a line inside the nozzle, the water is jetted out of the opening formed at the lower end of the nozzle, thus forming a high-speed water column. The water thus jetted is partially discharge from a gap formed between the cleaning surface and the lower end of the pencil sponge, the residual portion of the water is left remained as a low speed or still water 72 in the hollow portion of the pencil sponge. When the high-speed water 71 is jetted into the low speed or still water 72, the cavities 73 are generated due to the friction between these waters differing in speed. In view of the process of generating the cavity 73, if the inner diameter D for jetting the high speed water is larger, the surface area of the high speed water 71 increases, so that the contacting area thereof with the still water 72 is also increased. Further, when the height L from the wafer to the lower end of the nozzle is greater, i.e. when the position of jetting the high-speed water column is higher, the contacting area thereof with the still water 72 is increased likewise. Further, when the pressure P to be applied to the high-speed water is higher, the flow rate of the high-speed water is increased, so that the contacting area per unit time is increased. Therefore, these parameters all contribute to an increase of the contacting area of high-speed water with the still water 72, thus making them factors to more effectively generate the cavity 73.

Next, those hard parameters of the detergency of the Cavipen, (the diameter of the nozzle (D), the jetting position (L), the rotational speed of wafer and the pressure of cleaning liquid (P), FIG. 12) were varied, thereby to assess the cleaning effect.

Figure 13:
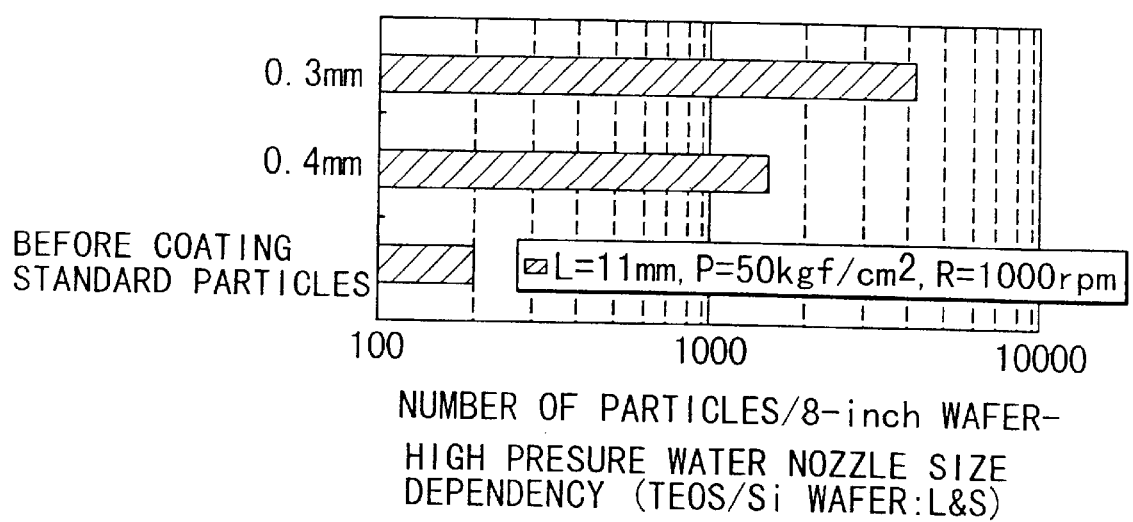
FIG. 13 is a graph illustrating the nozzle size dependency of the cleaning effect in the Cavipen cleaning method.

FIG. 13 shows differences in cleaning effect where the diameter of the nozzle (D) was set to 0.3 mm or 0.4 mm in the Cavipen cleaning method. As for the other parameters, the water jetting position (L) was set to 11 mm, the rotational speed of the wafer was set to 1,000 rpm, and the pressure (P) was set to 50 kgf/cm$^2$. As apparent from FIG. 13, the larger the diameter of the nozzle was, the higher the cleaning effect was.

FIG. 14 shows differences in cleaning effect where the water jetting position (L) was set to 7 mm or 11 mm in the Cavipen cleaning method. As for the other parameters, the diameter of the nozzle (D) was set to 0.3 mm, the rotational speed of the wafer was set to 1,000 rpm, and the pressure (P) was set to 110 kgf/cm$^2$. As apparent from FIG. 14, the higher the water jetting position was, the higher the cleaning effect was.

FIG. 15 shows differences in cleaning effect where the rotational speed of the wafer was set to 10 rpm, 100 rpm or 1,000 rpm in the Cavipen cleaning method. As for the other parameters, the diameter of the nozzle (D) was set to 0.3 mm, the water jetting position (L) was set to 11 mm, and the pressure IP) was set to 50 kgf/cm$^2$. As apparent from FIG. 15, the higher the rotational speed of the wafer was, the higher the cleaning effect was.

FIG. 16 shows differences in cleaning effect that may be caused by the difference in pressure to be applied to the cleaning liquid. Namely, the cleaning effect was measured by setting the pressure (P) to 50 kgf/cm$^2$ or 110 kgf/cm$^2$ under the conditions of: the diameter of the nozzle (D)=0.3 mm, the water jetting position (L)=11 mm, and the higher the rotational speed of the wafer=1,000 rpm. Additionally, the cleaning effect was measured by setting the pressure (P) to 30 kgf/cm$^2$60, kgf/cm$^2$ or 90 kgf/cm$^2$ under the conditions of: the diameter of the nozzle (D)=0.4 mm, the water jetting position (L)=11 mm, and the rotational speed of the wafer= 2,000 rpm. As apparent from FIG. 16, the higher the pressure (P) was, the higher the cleaning effect was.

Namely, as seen from FIGS. 13 to 16, the detergency of the Cavipen cleaning can be enhanced as the diameter of the nozzle becomes larger, as the water jetting position of the nozzle is further away from the wafer, as the pressure becomes higher, and as the rotational speed of the wafer becomes higher. It is possible, by setting these parameters to as larger value as allowable under the conditions regarding the cleaning apparatus, the material of cleaning surface, etc., to further enhance the cleaning effect in the Cavipen cleaning according to this invention.

[Dry/Wet and Film Quality Dependency]

When the effect of a cleaning process conducted after the dry-transferring is compared with the effect of the same cleaning process conducted after the wet-transferring, it is generally considered that since the particles are firmly adhered to a cleaning surface as it has been dry-transferred, a higher cleaning effect is required in the cleaning after the dry-transferring, in comparison with the cleaning after the wet-transferring. Further, it has been found that the cleaning effect varies depending on the kind of the film formed on the cleaning surface. The relationship between these factors and the Cavipen cleaning of this invention was also assessed as follows.

Experiments to measure and compare the alumina removal effect by the Cavipen cleaning were performed on the samples where a TEOS film, a poly-Si film or an SiN film was formed respectively on the recessed Si—L/S samples. The main conditions of the Cavipen cleaning (0.4 mm in the diameter of nozzle, 11 mm in the height of nozzle, 90 kgf/cm$^2$ in pressure of high pressure water, and 2,000 rpm in the rotational speed of wafer) were made constant. The cleaned results of these three kinds of samples which were obtained under a dry condition were measured, and at the same time, the cleaned result of a sample of SiN which was obtained under a wet condition was measured. Further, as a comparison standard, the cleaned result of the Pen cleaning which was obtained under a wet condition was also measured.

Figure 17:
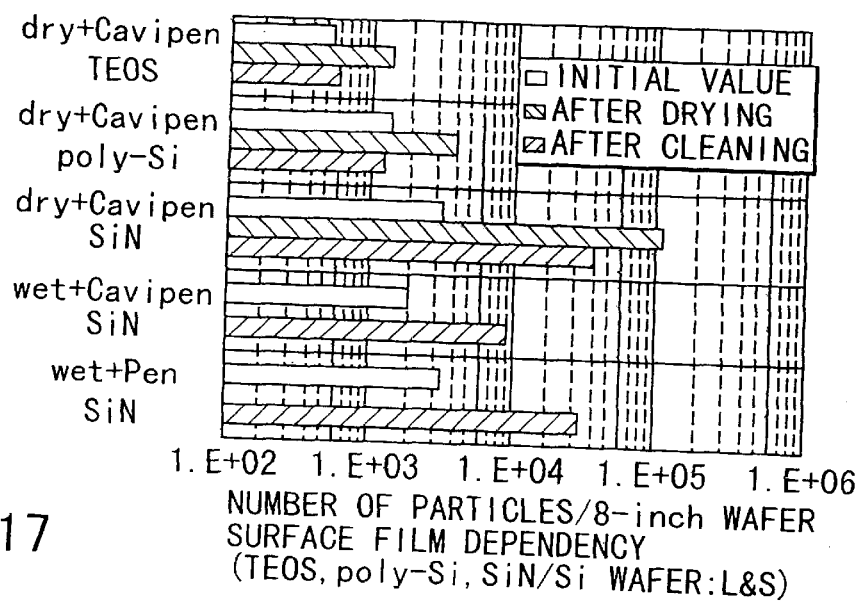
FIG. 17 is a graph illustrating the surface film quality dependency of the cleaning effect in the Cavipen cleaning method.

These results are shown in FIG. 17. In FIG. 17, "Initial value" denotes the number of particles remaining on the surface of a wafer after the formation of L/S recesses by RIE and before the coating of the standard particle solution, "After drying" denotes the number of particles remaining on the surface of a recess wafer which is coated with a standard particle solution and then dry-transferred, and "After cleaning" represents the number of particles remaining on the surface of a recess wafer which has been cleaned by respective cleaning methods.

First, the cleaning effects of the Cavipen cleaning in three different cases were compared, one is the case where the Cavipen cleaning is applied to a recess wafer having TEOS film (hereinafter "TEOS case"), the other a case where the Cavipen cleaning is applied to a recess wafer having poly-Si film (hereinafter "poly-Si case"), and another a case where the Cavipen cleaning is applied to a recess wafer having a SiN film (hereinafter "SiN case"). In the TEOS case and the poly-Si case, the particles had been removed by the Cavipen cleaning to the same level as the "Initial value", and thus it is found that the Cavipen cleaning has a sufficient cleaning effect regarding particles on a TEOS film and a poly-Si film. However, in the SiN case, the cleaning effect is considerably inferior to that in the TEOS case or poly-Si case.

Next, cleaning effects of the Cavipen cleaning are compared regarding a dry sample and a wet sample both having SiN film thereon. Since particles on a wet sample can easily be removed, in comparison with those on a dry sample, the cleaning effect in the wet sample is greater than that in the dry sample, while the cleaning effect regarding the wet sample did not attain the same level as the "Initial value". Nevertheless, it should be noted that the Cavipen cleaning of the present invention is superior in the cleaning effect to the conventional Pen cleaning method applied to a wet sample having a SiN film thereon.

It was found that, as far as recessed wafers having the TEOS film and the poly-Si film formed thereon are concerned, it was possible, by making use of the Cavipen cleaning, to reduce the number of particles relating to the dry sample to the same extent as that of the comparison standard where the Pen cleaning was applied to a wet sample. In the case of a recessed wafer having SiN film formed thereon however, it was impossible to fully reduce the number of particles to the same extent as that of the comparison standard, even if the wafer was a wet sample (which is easy to clean in general). On the other hand, in the case of the Pen cleaning, most of the alumina particles adhered on the SiN film were left unremoved even if the wafer was a wet sample.

[pH Dependency]

In view of clarifying the effect of chemical cleaning to be employed at the occasion of performing a physical cleaning, a test for investigating the hydrogen ion concentration (pH) dependency of the cleaning effect was performed. The pH in this test was changed by diluting an aqueous solution of ammonia with ultrapure water. The Cavipen cleaning was performed based on the aforementioned centering condition, and the Pen cleaning was also performed as a reference to be compared. In this test, the TEOS recessed wafer was employed, and the alumina removal effect was measured after performing the cleaning by making use of cleaning liquids differing in pH from each other (from pH 7 to pH 10). Further, as a comparative data, the cleaning effect of Pen cleaning performed at pH 7 was also measured. The results obtained are shown in FIG. 18.

Figure 18:
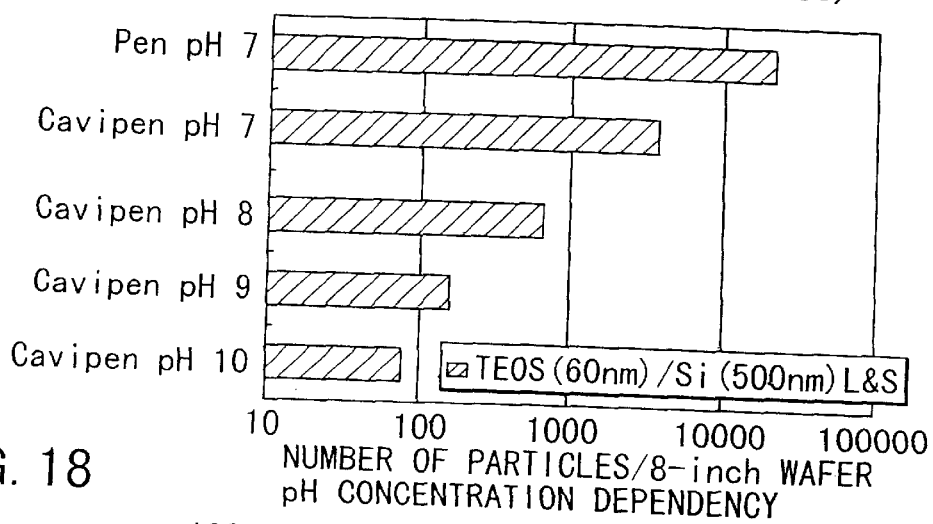
FIG. 18 is a graph illustrating the pH dependency of the cleaning effect in the Cavipen cleaning method.

As seen from FIG. 18, when the Pen cleaning was compared with the Cavipen cleaning at the same pH 7, the Cavipen cleaning was higher in detergency of the particles. Further, it was found that the cleaning efficiency of alumina particles in the Cavipen cleaning could be enhanced by increasing the pH value. Namely, it was found that the removal of the particles was dependent on the pH value. The reason for this pH dependency may be ascribed to the fact that the zeta potentials (electrical potential that exists across of an interface between all solids and all liquids) of the film and the particles are changed in accordance with the changes in pH value, and hence, the zeta potential difference between the film and the particles is also caused to change, thus giving rise to a change in repulsive force between the film and the particles. If this repulsive force is effected between the film and the particles, the particles can be easily moved away from the film, and at the same time, these particles once moved away from the film can be prevented from re-adhering to the film.

Since the cleaning effect is dependent on the kinds film as seen from the results shown in FIG. 17, and since the cleaning effect is dependent on the pH value as seen from the results shown in FIG. 18, it will be seen that the control of zeta potential may be required in the removal of particles. Since the TEOS film and the SiN film can be-scarcely etched by an aqueous ammonia solution of room temperature, if the surface potential difference between the film absorbing particles and the adsorbed particles is sufficiently large in a chemical solution, the repulsive force between the film and the particles would be increased, thereby facilitating the removal of the particles, and at the same time, the particles once moved away from the film can be prevented from re-adhering to the film. As for other means to control the zeta potential, a surfactant (cationic or anionic) may be employed.

Figure 19:
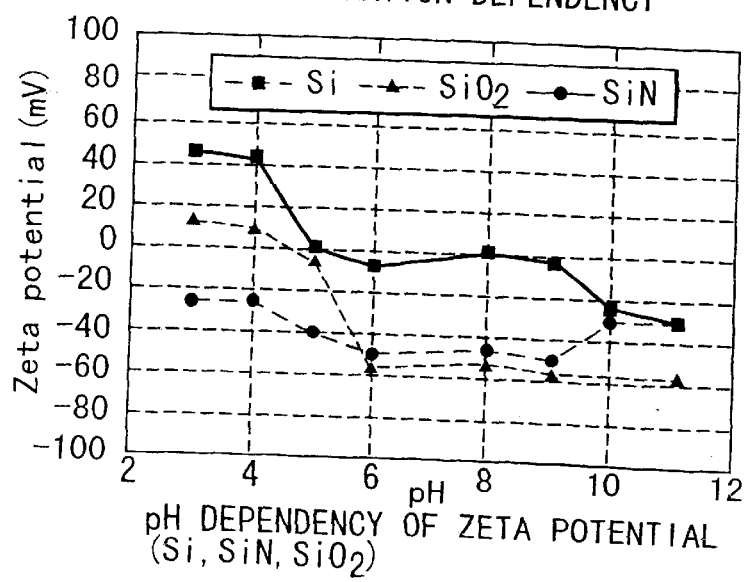
FIG. 19 is a graph illustrating the pH dependency of zeta potential of each of Si film, $SiO_2$ film and SiN film.

FIG. 19 shows the zeta potential dependency of the zeta potential of each of Si, $SiO_2$ and SiN films which was set forth in a publication, "Cleaning Technology of the Surface of Silicon Wafer" (Realize Co., Ltd., pp. 67, 1995, K. Kashiwagi et al). FIG. 20 shows the pH dependency of the zeta potential of each of $SiO_2$ and $Al_2O_3$ films which was set forth in a publication, "Mechanical brush scrubbing for post-CMP clean", Solid State Technology, pp. 109–114 (June, 1995), Wllbur C Krusell, John M. de Larlos, Jackle Zhang. As seen from those data, basically speaking, if pH is 7 or more, a silicon oxide film, a silicon nitride film and a silicon film are negatively charged, while alumina particles are positively charged when pH is 8 or less, and negatively charged when pH is more than 8.

When the alkalinity of a cleaning liquid is increased (if the concentration of hydroxyl concentration is increased), the electric potential of the surface of film becomes negative. Therefore, if the polarity of the electric potentials of the film and the adsorbed particles are assumed as being the same, the repulsive force between them would be increased as the electric potential difference of them is increased, thereby facilitating the removal of the particles. Namely, in the case that alumina particles are adhered to an $SiO_2$ film, when the alkalinity becomes higher, the negative potentials of the film and the adsorbed particles are increased, thereby facilitating the removal of the particles.

[Frequency Dependency]

It has been found from the results of various experiments mentioned above that the Cavipen cleaning method is very effective in removing the particles remained in a recessed portion. The reason for realizing the removal of particles in a recessed portion in spite of the fact that the Cavipen cleaning is non-contact cleaning may be ascribed to the fact that cavities can be effectively generated in the Cavipen cleaning. Therefore, the frequencies of sonic waves generated by the cavity in the Cavipen cleaning was measured and assessed. Additionally, for the purpose of comparison, the frequency in the MJ cleaning at the ordinary 1.6 MHz was also measured. The conditions of the Cavipen cleaning were selected from those where a substantial difference could be produced in the cleaning effect, i.e. the diameter "D" of the nozzle was set to 0.4 mm and the height "L" of the nozzle was set to 11 mm, while the pressure was varied to 30, 60 or 90 kgf/cm². As for the MJ cleaning, the frequency to be applied was set to 1.6 MHz. FIG. 21 shows the data on the frequency characteristics of the cleaning in each frequency as measured by means of a sound pressure sensor. The results shown in FIG. 21 seemingly indicate that the intensity of high-frequency wave in the MJ cleaning is higher than that of the Cavipen cleaning. As a matter of fact however, the above apparent difference in intensity between high-frequency waves generated by MJ and Cavipen was brought about due to the difference in the diameter of the nozzles between them (the MJ nozzle is greater than the Cavipen nozzle in diameter), which results in the difference in noise level of the acoustic pressure sensors used therefor. Thus, the experimental results shown in FIG. 21 never show that the high-frequency waves generated in the Cavipen cleaning was inferior in intensity as compared with that of the MJ cleaning.

As seen from the data indicated in FIG. 21, it was detected in the case of the MJ cleaning that a peak existed at a ¼ frequency (400 kHz) of 1.6 MHz. In the case of the Cavipen cleaning, high-frequency waves including frequency components continuous in a frequency band of 1 kHz or less was generated., and, when the pressure was increased, the intensity of all frequencies excluding those of more than 1 MHz was increased.

As mentioned above, the frequency band which is effective in giving a high particle-removing effect is not of an MHz band, but of a kHz band in the range of 200 to 700 kHz. As seen from the data indicated in FIG. 21, the cavities generated in the Cavipen cleaning generate high-frequency waves consisting mainly of a band of several hundreds kHz or not more than 1 MHz which is effective in giving a high particle-removing effect. Therefore, the generation of cavity is considered a main factor for rendering the Cavipen cleaning method to be effective in realizing a high particle removing effect.

(Third Embodiment)

Next, the semiconductor substrate cleaning apparatus according to a third embodiment of this invention will be explained in detail with reference to FIG. 23.

Figure 23:
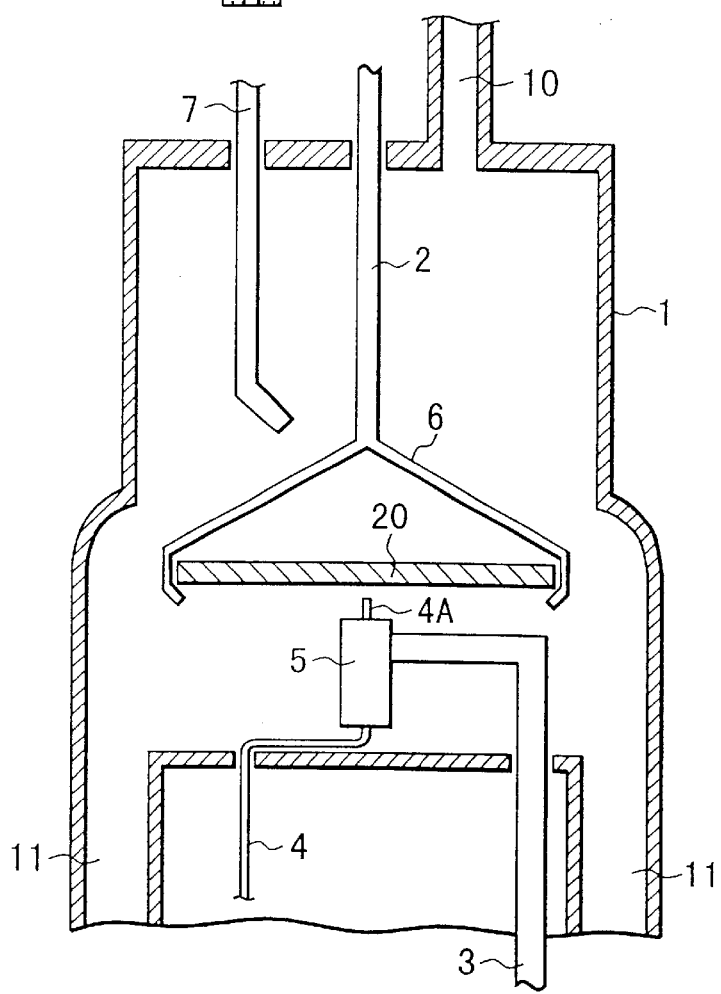
FIG. 23 represents a schematically sectional view illustrating a main portion of a semiconductor substrate cleaning apparatus according to a third embodiment of this invention wherein a semiconductor substrate is placed inside the cleaning apparatus.
Figure 24:
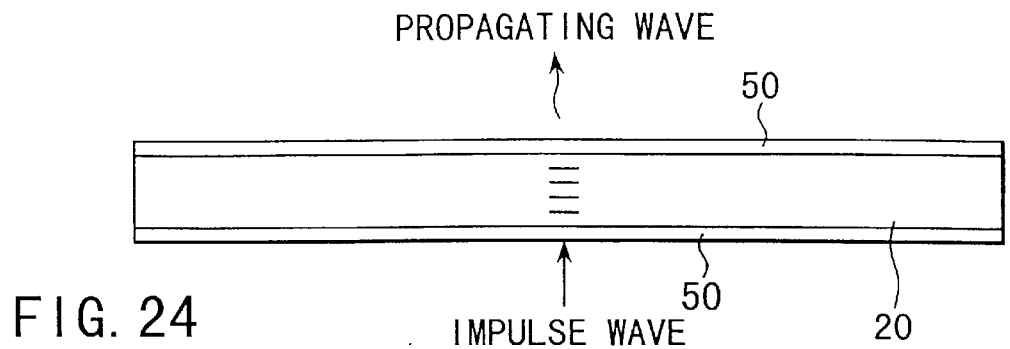
FIG. 24 is a diagram schematically showing a state wherein a high frequency wave is transmitted to a thin aqueous film 50 that has been formed on the reverse surface of a semiconductor substrate 20 at the moment of jetting a high pressure water, and then, propagated into the semiconductor substrate thereby to give an impact to the surface of the semiconductor substrate 20.

FIG. 23 represents a schematic sectional view illustrating a main portion of a semiconductor substrate cleaning apparatus according to a fourth embodiment of this invention wherein a semiconductor substrate is-placed inside the cleaning apparatus.

The same members and portions which are the same as those of FIG. 1 will be identified by the same reference numerals, thereby omitting the explanation thereof.

This embodiment differs from that of the first embodiment in that a substrate holder 2 (made of stainless steel which was coated with polyvinyl chloride for instance) is disposed inside the chamber 1 in such a manner that it passes through a central portion of the top wall of the chamber 1 while keeping an air-tightness between the top wall of the chamber 1 and the substrate holder 2 and at the same time, ensuring the rotatability of the substrate holder 2 in relative to the top wall of the chamber 1. This substrate holder 2 is connected at one end thereof with a rotating mechanism (not shown) which is disposed outside the chamber 1 thereby enabling the substrate holder 2 to be revolved at a high speed. The other end of the substrate holder 2 which is disposed inside the chamber 1 is connected with a substrate-mounting jig 6 for detachably mounting a semiconductor substrate. Namely, it is designed such that a semiconductor substrate 20 can be horizontally mounted on the substrate-mounting jig 6 with the top surface (a device-forming surface) of the semiconductor substrate 20 being directed upward and revolved through the rotation of the substrate holder 2.

Further, a rinsing water supply pipe 7 is protruded via a central portion of the top wall of the chamber 1 into the chamber 1 while ensuring an air-tightness between the top wall of the chamber 1 and the rinsing water supply pipe 7, thereby making it possible to feed a rinsing water (ultrapure water) to the surface of the semiconductor substrate 20.

On the other hand, a nozzle 4 which is formed of a Teflon tube, a fine stainless steel tube or a silicon nitride tube for jetting a high pressure water jet is disposed inside the chamber 1 in such a manner that the tip end 4A of the nozzle 4 is positioned below and slightly spaced away from the reverse surface of the semiconductor substrate 20. The nozzle 4 is fixingly retained, through a portion near the tip end 4a thereof, by a nozzle frame 5.

Further, a rod-like nozzle-supporting arm 3 having a circular cross-section is disposed inside the chamber 1 in such a manner that it passes through a bottom peripheral portion of the chamber 1 while ensuring an air-tightness between the bottom peripheral portion of the chamber 1 and the nozzle-supporting arm 3 and at the same time, ensuring the slidability of the nozzle-supporting arm 3. This nozzle-supporting arm 3 is connected at a lower end thereof with a rotating mechanism (not shown) which is disposed outside the chamber 1 thereby enabling the nozzle-supporting arm 3 to be revolved at a predetermined range of angle. Further, an upper portion of the nozzle-supporting arm 3 which is disposed inside the chamber 1 is L-shaped with the distal end thereof being directed toward the center of the chamber 1 and fixed to-the nozzle frame 5.

According to this cleaning apparatus which is constructed in this manner, the nozzle arm 5 can be stably retained by the nozzle-supporting arm 3, and when the nozzle-supporting arm 3 is rotated at a predetermined angle, the nozzle frame 5 is enabled to scan an entire area along the diametral direction of the semiconductor substrate 20, and when the substrate holder 2 is additionally rotated, the entire surface of the semiconductor substrate 20 can be allowed to come close to the tip end 4A of the nozzle 4.

The nozzle 4 (which is formed of a Teflon tube, etc.) is designed to function also as a feeding pipe for feeding water of high pressure. Further, while ensuring air tightness in relative to the chamber 1, the nozzle 4 is extended out of a bottom portion of the chamber 1, leaving a sufficient length thereof inside the chamber 1 so as enable it to follow the rotation of the nozzle-supporting arm 3. One end portion of the chamber 1 is connected with a high pressure water feeding source (not shown) thereby making it possible to continuously feed a high pressure water.

A gas inlet port 10 is formed at a central portion of the upper surface of the chamber 1 thereby making it possible to feed an inert gas such as nitrogen gas into the chamber 1. On the other hand, an exhaust port 11 connected with an outside exhauster (not shown) is formed at a lower portion of the chamber 1 which is lower than the mounting portion of the semiconductor substrate 20, thereby allowing an inert gas fed through the gas inlet port 10 to be discharged from this exhaust port 11.

Next, the method of cleaning the surface of a semiconductor substrate by making use of the aforementioned apparatus will be explained.

First of all, the semiconductor substrate 20 is transferred from the load lock chamber into the chamber 1, and fixed to the substrate-mounting jig 6, while positioning the reverse surface thereof close to the tip end 4A of the nozzle 4 (FIG. 23).

Then, the substrate holder 2 and the nozzle supporting arm 3 are rotated at a rotation speed of 100 rpm and at a scanning speed of 10 to 50 m/sec, respectively, and at the same time, nitrogen gas is introduced into the chamber 1 from the gas inlet port 10 at a flow rate of about 10 slm and then discharged from the exhaust port 11 to thereby form a gas flow inside the chamber 1. Then, a high pressure water having a pressure of 50 to 150 kgf/cm$^2$ is allowed to jet from the tip end 4A (5 mm in inner diameter) of the nozzle 4 at a flow rate of 1 to 10 sccm toward the reverse surface of the semiconductor substrate 20. At the same time, ultrapure water is fed from the rinsing water supply pipe 7 to the surface of the semiconductor substrate at a flow rate of 100 to 500 sccm.

In this case, it was confirmed by the present inventors that if a high-frequency wave in the order of 1.6 MHz for instance is impressed in advance on the high pressure water, the high-frequency will be propagated as an impulse wave to a thin water film 50 formed on the reverse surface of the semiconductor substrate 20 at the moment of jetting a high pressure water, and the high-frequency is propagated into the semiconductor substrate 20 to give a shock to the surface of the semiconductor substrate 20, whereby the fine dust that has been adhered onto the surface of the semiconductor substrate 20 would be vibrated and excited, thus causing the fine dust to float upward and enabling the fine dust to be easily removed by the rinsing water. At this moment, the attenuation of the impulse wave due to the propagation thereof through the semiconductor substrate 20 could be scarcely recognized, thus confirming the-same degree of generation of floating-up of dust as that of the first embodiment of this invention. The dust thus floated upward can be cleaned by the ultrapure water fed from the rinsing water supply pipe 7, thus making it possible to obtain a clean surface of the semiconductor substrate 20. Since the rinsing water in this case merely act to sweep away the floated dust, so that the rinsing water is not required to be a high pressure water, i.e. a low pressure of 0.1 to 1 kgf/cm$^2$ may be sufficient.

Figure 25:
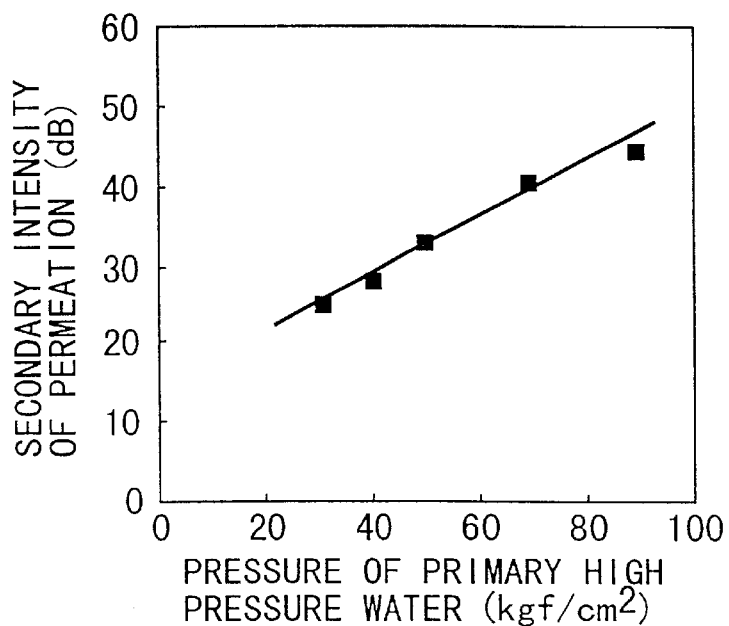
FIG. 25 is a graph illustrating a relationship between the pressure of a primary high pressure water to be jetted against the reverse surface of the semiconductor substrate 20 and the intensity of the impulse wave transmitted to the surface of the semiconductor substrate 20 (permeating secondary intensity)

As shown in FIG. 25, it has been confirmed that the pressure of a primary high pressure water to be jetted against the reverse surface of the semiconductor substrate 20 is proportional to the intensity of the impulse wave transmitted to the surface of the semiconductor substrate 20 (permeating secondary intensity), so that the intensity of the impulse wave can be controlled by means of the pressure of a primary high pressure water.

Since the ejection of the high pressure water is directed to the reverse surface of the semiconductor substrate 20 according to the semiconductor substrate cleaning method of this embodiment, the region where a mist can be generated is limited only to the reverse surface side of the semiconductor substrate 20 thereby prohibiting the mist from leaking into the top surface side of the semiconductor substrate 20. Therefore, there is no possibility of allowing the dust carried-by the mist to adhere on the top surface side of the semiconductor substrate 20.

In the cleaning method of semiconductor substrate according to this embodiment, the rinsing water for cleaning the surface of semiconductor substrate may be a low pressure water. It is desired to remove impurities such as metals (other than dust) which are kept adhered on-the surface of semiconductor substrate, an etching using an alkali may be effective. According to this embodiment however, a chemical material such as an acid or an alkali may be substituted for the aforementioned low pressure rinsing water. Namely, since the rinsing water is low in pressure, a chemical material can be scarcely splashed up to the upper portion of the cleaning apparatus and at the same time, since the mist which has been generated due to the high pressure water jetted toward the reverse surface of the semiconductor substrate cannot leak into the surface side of the semiconductor substrate 20, only the inner wall portions of the cleaning apparatus which are located lower than the semiconductor substrate 20 are required to be acid-resistive or alkali-resistive, thereby preventing the inner wall of the cleaning apparatus from being corroded even if a cleaning liquid containing an acid or an alkali is employed substituting the rinsing water, or preventing an inorganic salt such as ammonium chloride from adhering onto the inner wall-of the cleaning apparatus.

If required, a chemical material may be employed as a high pressure water for cleaning the reverse surface of the semiconductor substrate. By the way, according to the prior art, the mist from the high pressure water is allowed to float up to the upper portion of the cleaning apparatus, in particular, to penetrate into the load lock portion of the apparatus. A gate valve, etc. is required to be employed for this load lock portion in order to enable a semiconductor substrate to be introduced therein or discharged therefrom or to ensure a sufficient air-tightness between metallic surfaces at the occasion of closing the cleaning apparatus. Therefore, it has been impossible to constitute the load lock portion by an acid resistive or alkali resistive surface. However, since only the inner wall portions of the cleaning apparatus which are located lower than the semiconductor substrate are required to be acid-resistive or alkali-resistive according to this embodiment, the load lock portion is not required to be acid-resistive or alkali-resistive. Further, since a slidable portion located in the region lower than the semiconductor substrate is limited to a small region, the air-tightness of the slidable portion can be sufficiently ensured by making use of a Teflon seal, etc. Therefore, according to this embodiment, by making the inner wall portions of the cleaning apparatus which are located lower than the semiconductor substrate into an acid resistive or alkali resistive surface by making use of Teflon coating, etc., an acid or an alkali which is more excellent in detergency than pure water can be employed as a rinsing water or a high pressure water.

As for the acid and alkali to be employed in this case, hydrochloric acid, an aqueous solution of ammonia, an aqueous solution of hydrogen peroxide, an aqueous solution of ozone, an aqueous solution of electrolytic ion or a mixture thereof may be employed.

Figure 26:
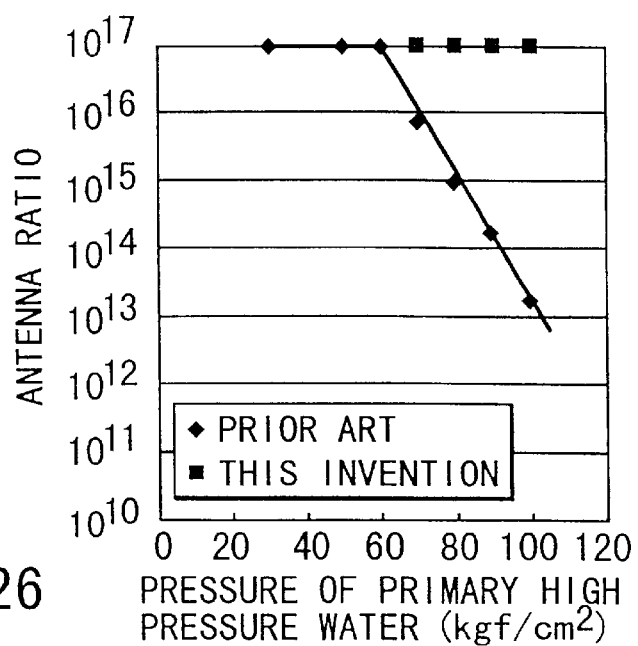
FIG. 26 is a graph illustrating the primary high pressure water pressure dependency of the minimum antenna ratio leading to the electrostatic breakdown of MOS capacitor at the occasion of cleaning a semiconductor substrate having the MOS capacitor formed on the surface thereof by making use of a semiconductor substrate cleaning apparatus according to a third embodiment of this invention, the primary high pressure water pressure dependency of the minimum antenna ratio being shown in comparison with the result obtained when a conventional semiconductor substrate cleaning apparatus was employed.

FIG. 26 illustrates the primary high pressure water pressure dependency of the minimum antenna ratio leading to the electrostatic breakdown of MOS capacitor at the occasion of cleaning a semiconductor substrate having the MOS capacitor formed on the surface thereof by making use of a semiconductor substrate cleaning apparatus according to this embodiment of this invention, the primary high pressure water pressure dependency of the minimum antenna ratio being shown in comparison with the result obtained when a conventional semiconductor substrate cleaning apparatus was employed. The antenna ratio in this case means the area of a capacitor electrode in relative to the area of capacitor oxide film in an MOS capacitor. The larger the antenna ratio is (the area of the electrode is relatively large), the more vulnerable the MOS capacitor becomes against the electrostatic breakdown.

As shown in FIG. 26, according to the prior art (when a conventional semiconductor substrate cleaning apparatus is employed), if the pressure of the primary high pressure water is set to 60 kgf/cm$^2$ or less, the antenna ratio giving rise to the electrostatic breakdown can be maintained at $1\times10^{17}$ or more. However, if the pressure of the primary high pressure water exceeds over 60 kgf/cm$^2$, the antenna ratio would be sharply decreased thus falling down to $1\times10^{13}$ if the pressure of the primary high-pressure water is set to 100 kgf/cm$^2$.

Whereas, when the semiconductor substrate cleaning apparatus according to this embodiment is employed, the antenna ratio can be maintained at $1\times10^{17}$ or more even if the pressure of the primary-high pressure water is 100 kgf/cm$^2$, thus suggesting a prominent difference between these apparatus. The reason for this may be ascribed to the fact that according to the prior art, a static electricity is caused to generate on the surface of semiconductor substrate due to a friction between the surface of a semiconductor substrate and the high pressure water at the occasion of jetting the water, the magnitude of the static electricity being approximately proportional to the pressure of the high pressure water. Whereas, when the semiconductor substrate cleaning apparatus according to this embodiment is employed, there is little possibility that the high pressure water is contacted with the surface of semiconductor substrate, thus greatly minimizing any possibility of generating a static electricity on the surface of semiconductor substrate. Therefore, according to this embodiment, there is little possibility of generating a breakdown of semiconductor element formed on the surface of semiconductor substrate, thereby making it possible to provide a semiconductor substrate cleaning method which ensures a high reliability of semiconductor element.

Next, a modified example of the semiconductor substrate cleaning apparatus according to this embodiment will be explained with reference to drawings.

Figure 27:
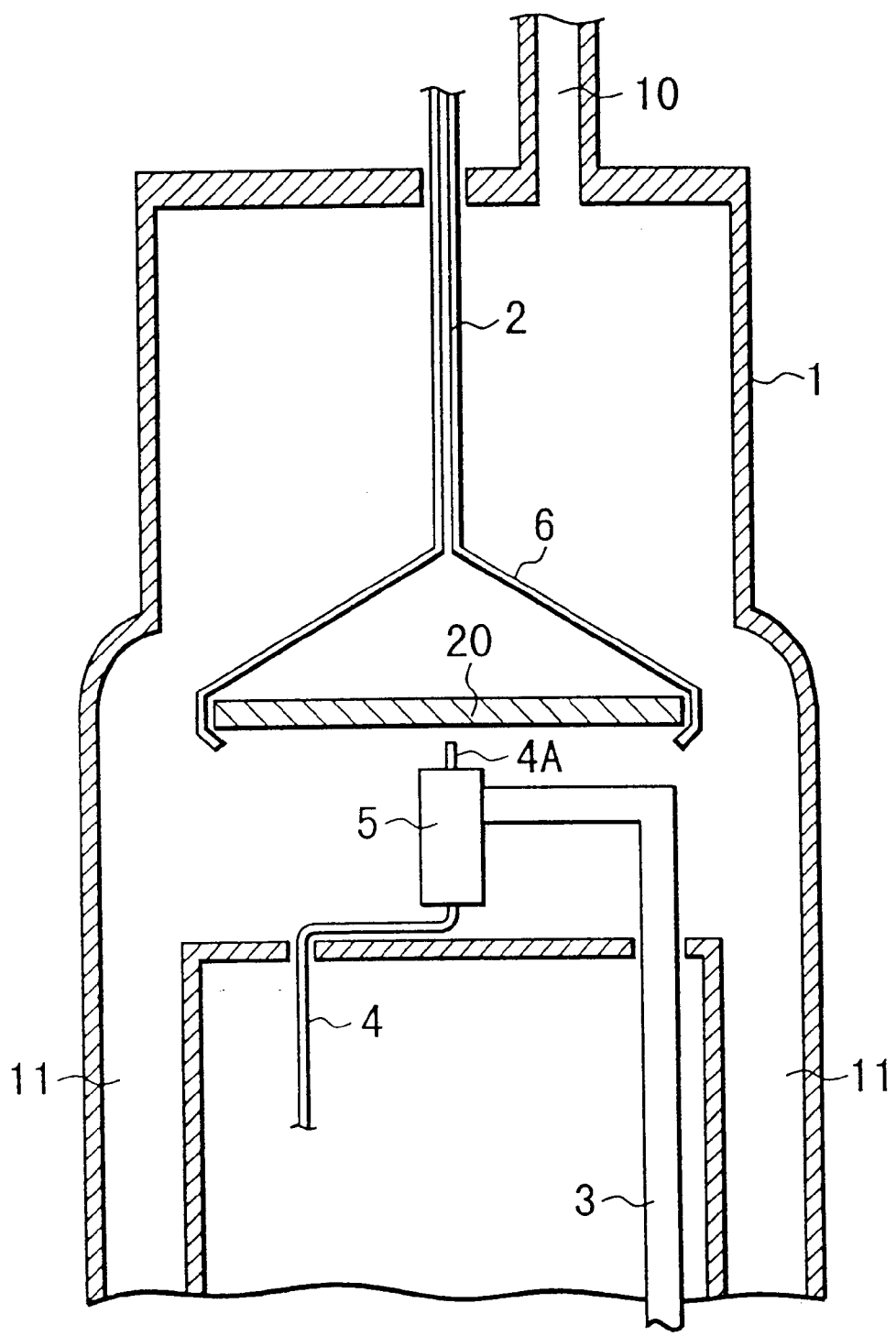
FIG. 27 is a schematically sectional view illustrating a first modification of the third embodiment of this invention.

FIG. 27 represents a schematic sectional view illustrating a first modified example of the semiconductor substrate cleaning apparatus.

The same members and portions which are the same as those of FIG. 23 will be identified by the same reference numerals, thereby omitting the explanation thereof.

Figure 28:
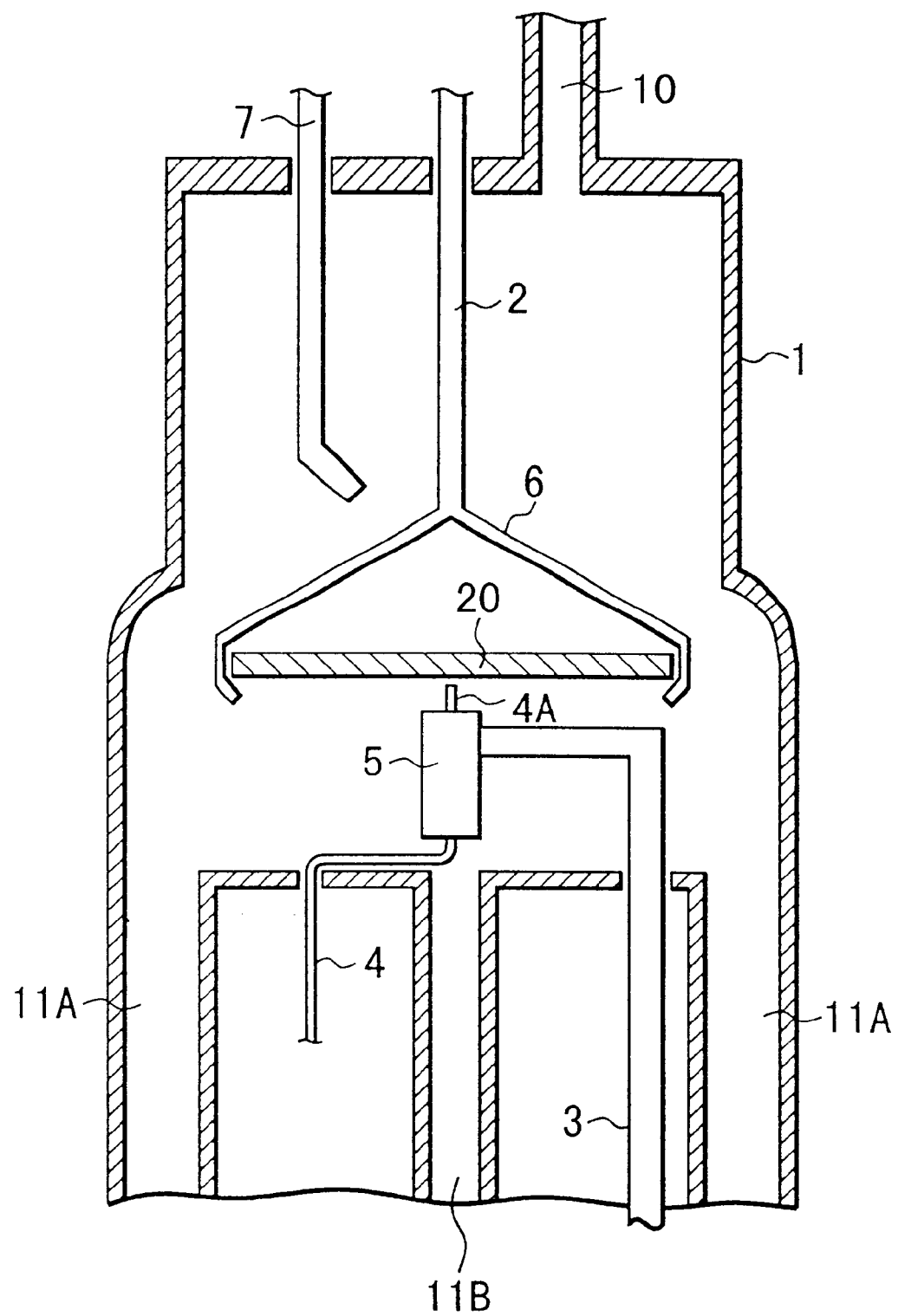
FIG. 28 is a schematically sectional view illustrating a second modification of the third embodiment of this invention.

In this modified example, a substrate holder/rinsing water supply pipe 8 which is capable of functioning as the substrate holder 2 and also as the rinsing water supply pipe 7 both shown in FIG. 23 is employed. The distal end of the substrate holder/rinsing water supply pipe 8 which is disposed inside the chamber 1 is connected with a substrate-mounting jig 6 for detachably mounting a semiconductor substrate. This substrate-mounting jig 6 is provided with a plurality of securing pins (3 to 5 pins) so as to fixingly mount a semiconductor substrate 20 in such a manner that the semiconductor substrate 20 is kept horizontal with the top surface (a device-forming surface) thereof being directed upward. Namely, the semiconductor substrate 20 is allowed to revolve through the rotation of the substrate holder/rinsing water supply pipe 8 which is protruded into the chamber 1 through the top wall portion of the chamber 1 while being ensured of its slidable movement and air-tightness in relative to the top wall portion of the chamber 1. Since the cleaning apparatus according to this modified example is constructed in this manner, this cleaning apparatus is provided, in addition to the features of the aforementioned semiconductor substrate cleaning apparatus according to the second embodiment of this invention, with a specific feature that the surface of the semiconductor substrate 20 can be always covered during the cleaning step thereof by the rinsing water fed through the central portion of the surface of the semiconductor substrate 20, thus leaving no room to allow the floating dust in a gas phase to adhere onto the surface of the semiconductor substrate 20, and making it possible to obtain a further cleaner semiconductor substrate. FIG. 28 represents a schematic sectional view illustrating a second modified example of the semiconductor substrate cleaning apparatus.

The same members and portions which are the same as those of FIG. 23 will be identified by the same reference numerals, thereby omitting the explanation thereof.

In this modified example, another exhaust port 11B is provided at the central portion of the bottom of the chamber 1 in addition to the exhaust ports 11A which are disposed respectively at a peripheral bottom portion of the chamber 1. Since any gas is allowed to discharge through this exhaust port 11B, the mist generated at the reverse surface of the semiconductor substrate can be discharged from a region close to the reverse surface of the semiconductor substrate. Therefore, in addition to the features of-the aforementioned semiconductor substrate cleaning apparatus according to the second embodiment of this invention, it becomes possible according to this modified example to suppress the reflection of mist from the bottom surface of the cleaning apparatus, and to reduce the volume of the lower portion of the chamber 1, thus making it possible to minimize the cleaning apparatus.

(Fourth Embodiment)

Next, the semiconductor substrate cleaning apparatus according to a fourth embodiment of this invention will be explained in detail with reference to FIG. 29.

Figure 29:
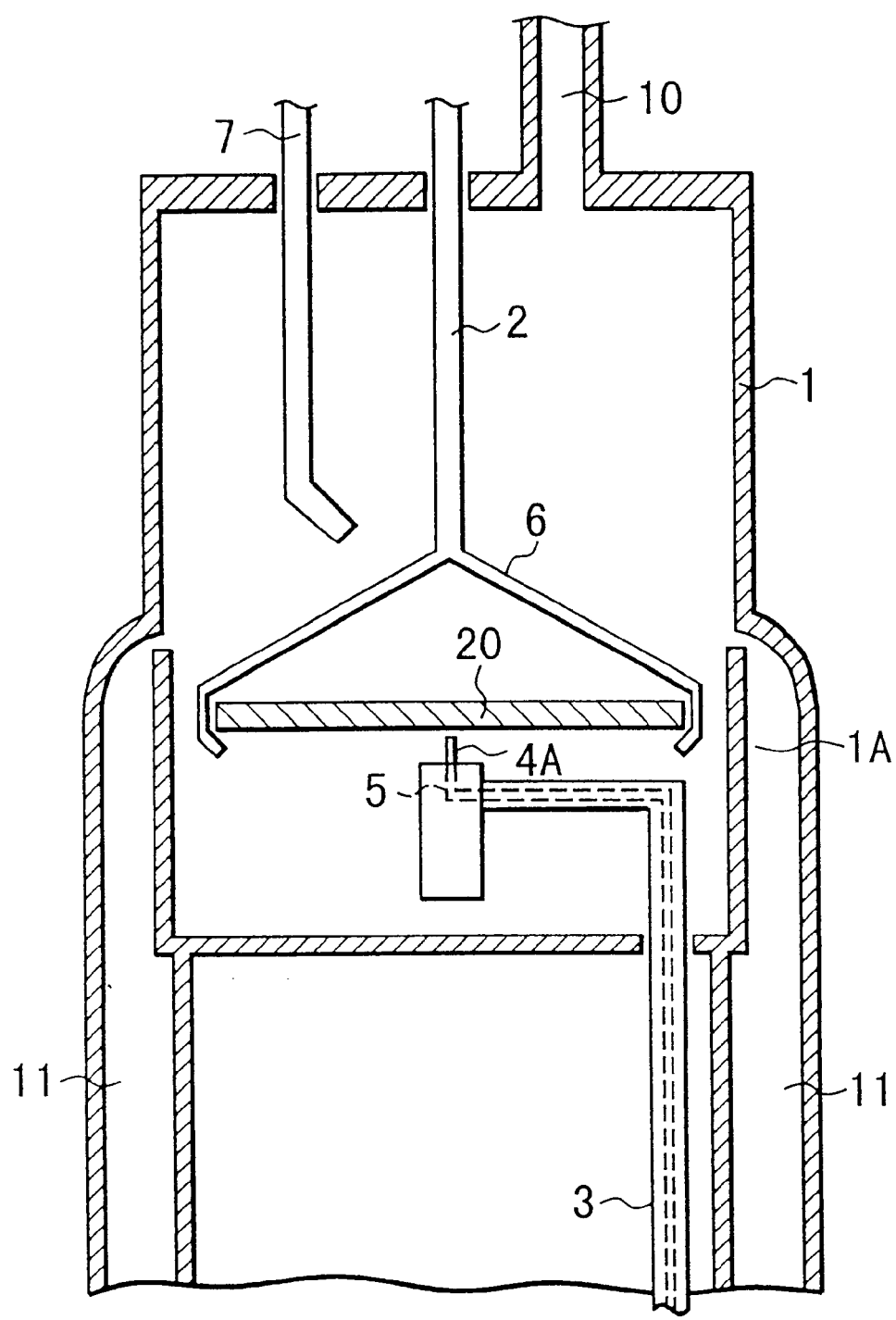
FIG. 29 represents a schematically sectional view illustrating a main portion of a semiconductor substrate cleaning apparatus according to a fourth embodiment of this invention wherein a semiconductor substrate is placed inside the cleaning apparatus.

FIG. 29 represents a schematic sectional view illustrating a main portion of a semiconductor substrate cleaning apparatus according to a fourth embodiment of this invention wherein a semiconductor substrate is placed inside the cleaning apparatus.

The same members and portions which are the same as those of FIG. 23 will be identified by the same reference numerals, thereby omitting the explanation thereof.

According to this embodiment, a cleaning tank 1A having a bottom surface which is common with that of the chamber 1 is disposed inside the chamber 1 in such a manner that it is capable of enclosing a region to mount a semiconductor substrate and the tip end 4A of nozzle.

The semiconductor substrate 20 can be attached to the substrate holder 2 disposed inside the chamber 1 through a load lock chamber (not shown). An up-and-down shifting mechanism (not shown) is attached to the substrate-holder 2 in this embodiment so as to make it possible to move the substrate holder 2 up and down, and to rotate the substrate holder 2. Therefore, first of all, the semiconductor substrate 20 is introduced into the chamber 1 and fixed-to the substrate-mounting jig 6, and then, the substrate holder 2 is moved down in relative to the chamber 1, thereby placing the semiconductor substrate 20 inside the cleaning tank 1A.

Further, the nozzle 4 is housed inside a nozzle supporting arm, and extended out of the chamber 1 together with the nozzle supporting arm, thus allowing a high pressure water to be fed from an outside source into the nozzle 4.

A rinsing water can be fed via a rinsing water supply pipe 7 into the cleaning tank 1A, thereby making it possible to fill the cleaning tank 1A.

Further, an exhaust valve (not shown) is attached to a lower portion of the cleaning tank 1A, thereby allowing the rinsing water inside the cleaning tank 1A to be discharged by opening the valve as desired. Further, this discharging of water out of the cleaning apparatus can be executed through the exhaust port 11.

Next, the method of cleaning a semiconductor substrate by making use of the aforementioned-apparatus will be explained in detail with reference to FIG. 29.

First, the semiconductor substrate 20 is transferred through the load lock chamber (not shown) into the-chamber 1, and fixed to the substrate-mounting jig 6.

Then, the substrate holder 2 is moved downward until the semiconductor substrate 20 is placed close to the tip end 4A of the nozzle and at the same time, placed inside the cleaning tank 1A. In this case, the substrate holder 2 is connected with a rotating mechanism (not shown) disposed outside the chamber 1 so as to allow the substrate holder 2 to rotate in situ.

Then, ultrapure water is fed from the rinsing water supply pipe 7 to the cleaning tank 1A thereby to fill the cleaning tank 1A with the ultrapure water, after which a valve (not shown) attached to a lower portion of the cleaning tank 1A is opened while continuing the feeding of the ultrapure water, thereby allowing the ultrapure water in the cleaning tank 1A to be gradually replaced by a fresh water. Alternatively, the ultrapure water may be fed to the cleaning tank 1A to allow an excess quantity of the ultrapure water to overflow out of the cleaning tank 1A instead of discharging the ultrapure water through the valve.

Under this condition, a high pressure water is jetted from the tip end 4A of the nozzle toward the reverse surface of the semiconductor substrate 20, and at the same time, the nozzle-supporting arm 3 and the substrate holder 2 are kept rotated.

When a semiconductor substrate is cleaned in this manner according to this embodiment, the following effects can be obtained in addition to the effects obtained in the cleaning method of semiconductor substrate according to the aforementioned third embodiment.

1) Since the semiconductor substrate 20 is always submerged in ultrapure water, the surface of the semiconductor substrate 20 can be prevented from being contacted with a gas phase.

As compared with a gas phase, ultrapure water is free from mist and substantially free from dust. Therefore, when the cleaning is performed in ultrapure water while performing sequential replacement of the ultrapure water, a very clean surface of semiconductor substrate which is free from the adhesion of dust and also free from the re-adhesion of dust can be obtained.

2) When the inner wall of the cleaning tank 1A, the nozzle-frame 5, the substrate-mounting jig 6 and the nozzle supporting arm 3 are respectively formed of or coated with Teflon which is excellent in chemical resistance, an acidic or alkaline cleaning liquid can be employed as a rinsing water. As a result, a metallic matter adhered on the surface of semiconductor substrate can be also removed. The cleaning using an acidic or alkaline cleaning liquid may be followed by a cleaning using ultrapure water. In this case, the number of the rinsing water supply pipe may be increased so as to allow this increased number of rinsing water supply pipes to be employed according to the kinds of rinsing water.

Figure 30:
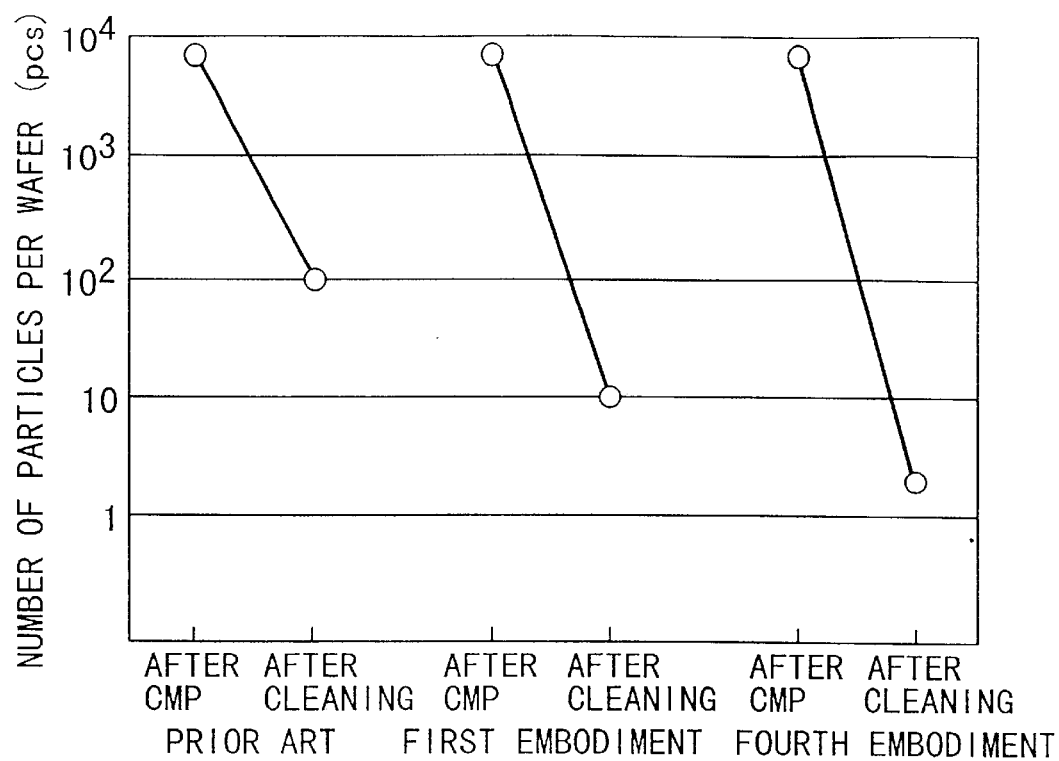
FIG. 30 is a graph illustrating the number of particles adhering on the surface of a semiconductor substrate which was cleaned according to the fourth embodiment of this invention, the result being shown in comparison with the results obtained using a conventional cleaning method and using the cleaning method according to the first embodiment of this invention.

FIG. 30 shows the number of particles adhering on the surface of a semiconductor substrate which was cleaned according to the fourth embodiment of this invention, the result being shown in comparison with the results obtained using a conventional cleaning method and using the cleaning method according to the first embodiment of this invention.

Since the removal of dust is conducted in a flowing water according to this embodiment, there is little possibility that the floating mist can be re-adhered onto the surface of the semiconductor substrate 20. Therefore, even when the cleaning method according to this embodiment is compared with the cleaning method according to the first embodiment, the number of residual particle can be further reduced by this embodiment.

Figure 31A:
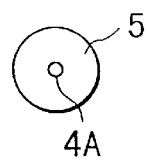
FIGS. 31A to 31C are top plan views of the nozzle tip 4A and of the nozzle frame 5 according to modifications of the fourth embodiment.

Next, a modified example of this embodiment will be explained with reference to FIGS. 31A to 31C. FIG. 31A shows a plan view of the nozzle tip end 4A as well as a plan view of the nozzle frame 5. In this case, the tip end 4A of nozzle which is formed of a fine Teflon tube is protruded from a central portion of the cylindrical nozzle frame 5.

Figure 31B:
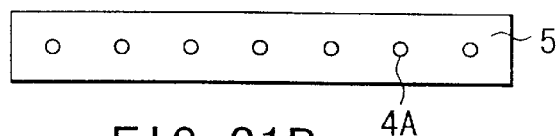

FIG. 31B shows a first modification of the tip end 4A of nozzle as well as of the nozzle frame 5. In this case, a plurality of nozzle tip ends 4A are protruded from a rectangular parallelepiped nozzle frame 5 whose length approximately corresponds with the diameter of the semiconductor substrate to be cleaned.

Figure 31C:
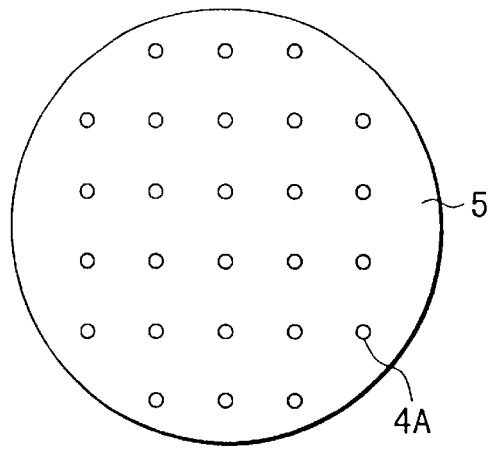

FIG. 31C shows a second modification of the tip end 4A of nozzle as well as of the nozzle frame 5. In this case, a plurality of nozzle tip ends 4A are protruded from almost the entire surface of the nozzle frame 5 which is shaped into a disc having a thickness approximately corresponding with the thickness of the semiconductor substrate to be cleaned.

Since the nozzle tip ends 4A are protruded corresponding with the diametral direction of a semiconductor substrate or with the entire surface of semiconductor substrate in these modified examples, the entire surface of the reverse surface of the semiconductor substrate can be cleaned by merely rotating the substrate holder 2 shown in FIG. 29 without accompanying the rotation of the nozzle supporting arm 3.

In the case of the second modified example, as long as the nozzle tip end 4A is sufficiently hermetically formed, the entire inverse surface of the semiconductor substrate can be cleaned without, accompanying the rotations of the substrate holder 2 and the nozzle supporting arm 3. It will become possible by making use of these modified examples, to reduce the number of rotational portions of the cleaning apparatus and to simplify the structure of the apparatus. Although a plurality of nozzle tip ends 4A are required to be installed in these modified examples, since the nozzle 4 is fine in diameter, these nozzles 4 may be joined together so as to place them into the interior of the nozzle supporting arm 3.

(Fifth Embodiment)

Next, the semiconductor substrate cleaning apparatus according to a fifth embodiment of this invention will be explained in detail with reference to FIG. 32.

Figure 32:
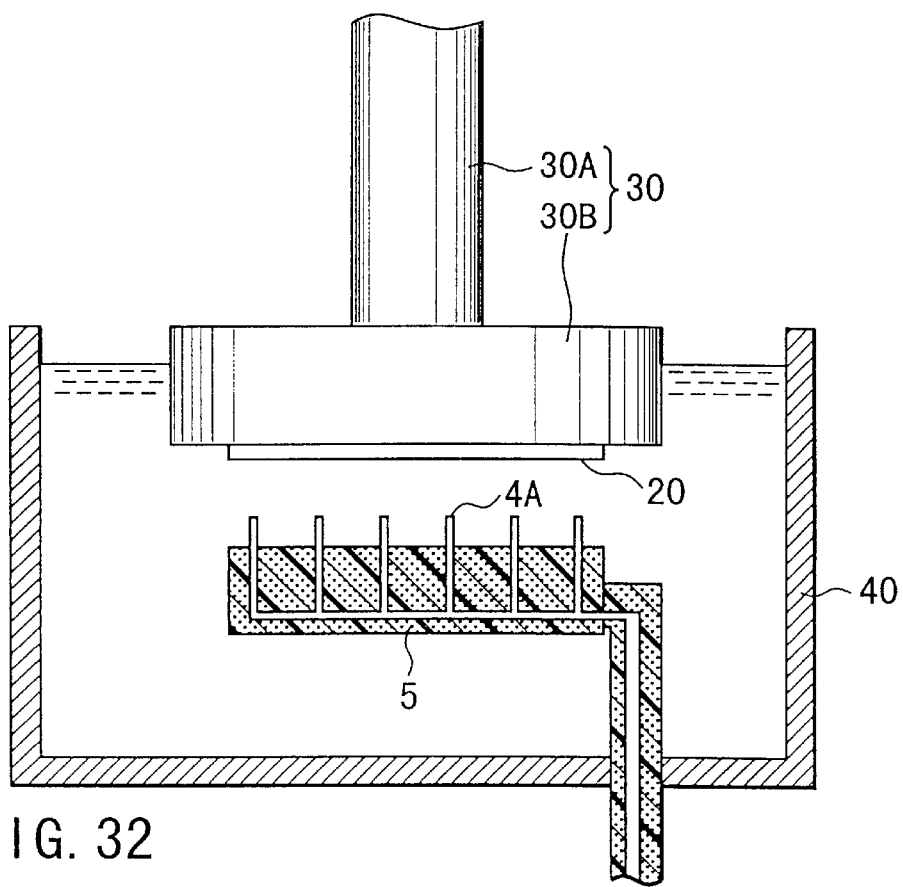
FIG. 32 is a cross-sectional view of a main portion of the cleaning apparatus according to a fifth embodiment of this invention.

FIG. 32 illustrates a cross sectional view of a main portion of the cleaning apparatus for cleaning a semiconductor substrate 20 which has been lapped and adhered to a lapping jig 30 consisting of shaft 30A and a lapping disc 30B, and adapted to be employed in a lapping step to be performed using a CMP (Chemical Mechanical Polish) apparatus.

The semiconductor substrate 20 adhered to the lapping jig 30 will be immersed in a lapping disc cleaning tank 40 filled with a pure water after finishing the lapping step and before being transferred to the next step. The semiconductor substrate 20 immersed in a lapping disc cleaning tank 40 in this manner then subjected to the cleaning of reverse surface thereof by means of a high pressure water to be jetted from a plurality of nozzle tip ends 4A arranged in the nozzle frame 5 which has been installed inside the lapping disc cleaning tank 40. In this case, the rectangular parallelepiped nozzle frame 5 or a thick, disc-like nozzle frame 5 which are explained in the modified examples of aforementioned fourth embodiments may be employed as a nozzle frame in the cleaning the semiconductor substrate 20 wherein either the nozzle frame 5 or the lapping jig 30 is rotated (when the rectangular parallelepiped nozzle frame 5 is to be employed) or both nozzle frame 5 and lapping jig 30 are kept locked (when the thick disc-like nozzle frame 5 is to be employed), thereby making it possible to sufficiently perform the cleaning within a short period of time.

Figure 33:
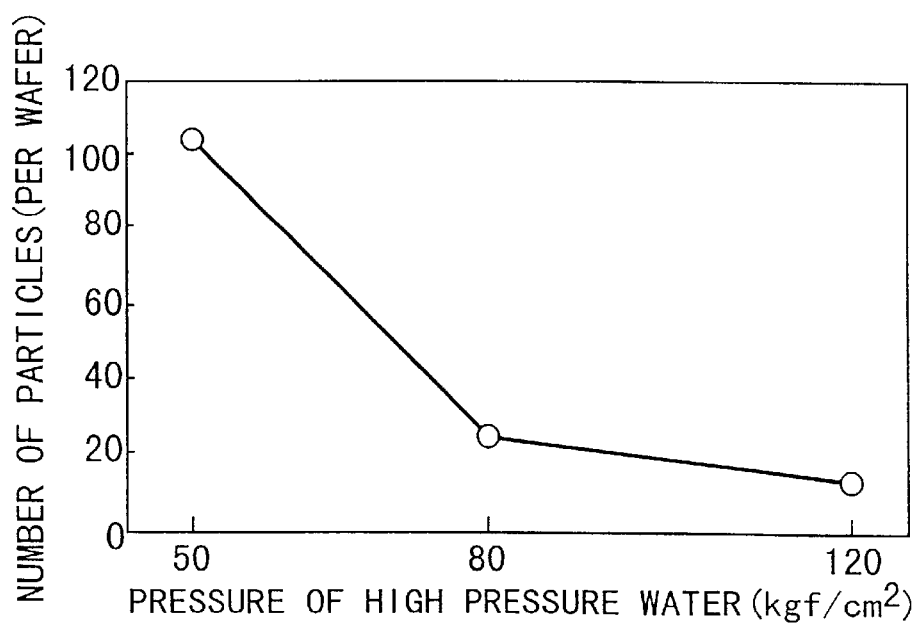
FIG. 33 is a graph illustrating a relationship between the pressure of a high pressure water (50 $kgf/cm^2$) and the number of residual particles (particles count/wafer) after the cleaning step, where a semiconductor substrate was cleaned using a cleaning apparatus according to the fifth embodiment.

FIG. 33 shows a relationship between the pressure of high pressure water (50 kgf/cm$^2$) and the number of residual particles (particles count/wafer) after the cleaning step. As shown in FIG. 33, it is possible, by making use of the method of this fifth embodiment and if the pressure of high pressure water is set to 120 kgf/cm$^2$, to reduce the number of residual particles to 20 or less even if the surface to be cleaned is very dirty due to the CMP processing.

By the way, although the Teflon tube, stainless tube and silicon nitride tube are referred to as being useful as an example of the nozzle 4 in each of the embodiments, it may be suitably changed depending on the pressure of the high pressure water to be passed through the nozzle. For example, a portion between a high pressure pump and the nozzle tip end may be constituted by a stainless steel tube and only the nozzle tip end may be constituted by a silicon nitride tube. If the nozzle is constructed in this manner, a tube which is sufficiently resistive to a high pressure water, and is substantially free from contamination (in particular, a portion near the semiconductor substrate), can be obtained. Further, if the inner wall of the stainless tube is covered with a chromium oxide film, a high-pressure chemical solution (liquid) can be substituted for the high pressure water. Alternatively, only a tip end portion of Teflon tube may be constituted by silicon nitride. If the tube is constructed in this manner, a tube excellent in chemical resistance can be obtained. Further, depending on the pressure of the high-pressure water, a polyvinyl chloride tube may be useful. These structures set forth hereinabove may be variously altered within the spirit of the present invention.

As explained above, it is possible according to this invention to provide a substrate cleaning apparatus which would not give rise to the re-adhesion of dust. If required, chemicals such as an acid or an alkali can be employed in this substrate, cleaning apparatus. Further, it is possible according to this invention to provide a semiconductor substrate cleaning method which would not give rise to the, re-adhesion of dust. It is possible according to this invention to provide a non-contact type semiconductor substrate cleaning method which is capable of generating a high-frequency wave having a frequency band which is effective in removing particles without requiring a plurality of frequency-generating sources, and capable of exhibiting a high particle removing effect irrespective of the conditions of the surface (flat surface or recessed surface) to be cleaned. It is possible according to his invention to modify the CMP post cleaning module wherein a three-step cleaning is conventionally required into, a two-step cleaning by, combining it with the R/S cleaning, thereby making it possible to expect a high particle cleaning effect even a wafer to be cleaned is accompanied with a recessed portion.

Additional advantages and modifications will readily occur to those-skilled in the art. Therefore, the invention in its broader aspects is not limited to the specific details and representative embodiments shown and described herein. Accordingly, various modifications may be made without departing from the spirit or scope of the general inventive concept, as defined by the appended claims and their equivalents.

What is claimed is:

1. A substrate cleaning apparatus which comprises:
   a substrate holder for holding a substrate;
   a high-pressure cleaning liquid jetting mechanism having
      a sponge with a solid portion and a hollow portion, and
      a high-pressure nozzle mounted within the hollow portion of the sponge,
      wherein said solid portion contacts one planer surface of said substrate held by said substrate holder and said nozzle jets the cleaning liquid in the hollow portion at said one planer surface to form cavities of the cleansing liquid on the planer surface of the semiconductor substrate, wherein breakage of the cavities generates high frequency sonic waves including frequency components continuous in a band of several hundred kHz and not more than 1 MHz;
   a chamber housing said substrate holder and said high-pressure cleaning liquid jetting mechanism;

a gas-feeding port communicated with said chamber;

a gas exhaust port communicated with said chamber; and a rinsing water feeding pipe for feeding a rinse liquid to the other planer surface of said substrate.

2. A substrate cleaning apparatus according to claim 1, wherein said high-frequency sonic waves include a high-frequency wave component of at least 400 kHz.

3. A substrate cleaning apparatus according to claim 1, wherein said high-frequency sonic waves have frequency components continuous in a frequency band of 800 kHz or less.

4. A substrate cleaning apparatus according to claim 1, wherein said nozzle is mounted on a movable mechanism for movably disposing the nozzle over said semiconductor substrate.

5. A substrate cleaning apparatus according to claim 1, wherein said semiconductor substrate is provided on a substrate rotating mechanism.

6. A substrate cleaning apparatus which comprises:

a substrate holder for holding a substrate;

a high-pressure cleaning liquid jetting mechanism having
  a sponge with a solid portion and a hollow portion, and
  a high-pressure nozzle mounted within the hollow portion of the sponge,
  wherein said solid portion contacts one planer surface of said substrate held by said substrate holder and said nozzle jets the cleaning liquid in the hollow portion at said one planer surface to form cavities of the cleansing liquid on the planer surface of the semiconductor substrate, wherein breakage of the cavities generates high frequency sonic waves including frequency components continuous in a band of several hundred kHz and not more than 1 MHz;

a chamber housing said substrate holder and said high-pressure cleaning liquid jetting mechanism;

a gas-feeding port communicated with said chamber;

a gas exhaust port communicated with said chamber; and which further comprises a cleaning tank having a bottom surface which is common with that of the chamber, which is capable of storing the cleaning liquid therein and which is housed inside said chamber, said cleaning tank being capable of housing therein said high-pressure cleaning liquid jetting mechanism and said substrate holder.

7. A substrate cleaning apparatus according to claim 6, wherein said high-frequency sonic waves include a high-frequency wave component of at least 400 kHz.

8. A substrate cleaning apparatus according to claim 6, wherein said high-frequency sonic waves have frequency components continuous in a frequency band of 800 kHz or less.

9. A substrate cleaning apparatus according to claim 6, wherein said nozzle is mounted on a movable mechanism for movably disposing the nozzle over said semiconductor substrate.

10. A substrate cleaning apparatus according to claim 6, wherein said semiconductor substrate is provided on a substrate rotating mechanism.

11. A cleaning method of semiconductor substrate, which comprises:

placing a semiconductor substrate on a substrate holder installed inside a substrate cleaning chamber;

housing said substrate holder in a cleaning tank placed inside said substrate cleaning chamber, the cleaning tank having a bottom surface which is common with that of the chamber;

filling said cleaning tank with a cleaning liquid thereby dipping said semiconductor substrate in said cleaning liquid;

mounting a high-pressure nozzle within a hollow portion of a sponge;

contacting a solid portion of said sponge with one planer surface of said semiconductor substrate held by said substrate holder; and jetting, in the hollow portion from said nozzle, a high pressure cleaning liquid at said one planer surface to form cavities of the cleaning liquid on the planer surface of the semiconductor substrate, wherein breakage of the cavities generates high frequency sonic waves including frequency components continuous in a band of several hundred kHz and not more than 1 MHz.

12. A cleaning method according to claim 11, wherein said high-frequency sonic waves include a high-frequency wave component of at least 400 kHz.

13. A cleaning method according to claim 11, wherein said high-frequency sonic waves have frequency components continuous in a frequency band of 800 kHz or less.

14. A cleaning method according to claim 11, wherein said nozzle is mounted on a movable mechanism for movably disposing the nozzle over said semiconductor substrate to said one planar surface to be cleaned.

15. A cleaning method according to claim 11, wherein said semiconductor substrate is rotated while the substrate is cleaned.

* * * * *